United States Patent [19]
Tanaka et al.

[11] Patent Number: 5,773,911
[45] Date of Patent: Jun. 30, 1998

[54] SURFACE ACOUSTIC WAVE DEVICE

[75] Inventors: Mitsuhiro Tanaka, Chita-Gun; Masao Takeuchi, Natori; Kazuhiko Yamanouchi; Hiroyuki Odagawa, both of Sendai, all of Japan

[73] Assignee: NGK Insulators, Ltd., Japan

[21] Appl. No.: 901,277

[22] Filed: Jul. 29, 1997

Related U.S. Application Data

[63] Continuation of Ser. No. 524,061, Sep. 6, 1995, abandoned.

[30] Foreign Application Priority Data

| Sep. 28, 1994 | [JP] | Japan | 6-233550 |
| Oct. 25, 1994 | [JP] | Japan | 6-260488 |
| Jan. 23, 1995 | [JP] | Japan | 7-008048 |

[51] Int. Cl.$^6$ .................................................. H03H 9/145
[52] U.S. Cl. ............................. 310/313 B; 310/313 A; 333/194
[58] Field of Search ........................... 310/313 A, 313 B, 310/313 D, 313 R; 333/193–195

[56] References Cited

U.S. PATENT DOCUMENTS

| 3,686,518 | 8/1972 | Hartmann et al. | 310/313 R |
| 3,748,603 | 7/1973 | Wojcik | 310/313 R |
| 4,006,438 | 2/1977 | Bennett | 310/313 D |
| 4,013,983 | 3/1977 | Hartemann | 310/313 R |
| 4,087,714 | 5/1978 | La Rosa et al. | 310/313 R |
| 4,353,046 | 10/1982 | Hartmann | 310/313 D |
| 4,429,246 | 1/1984 | Miyajima | 310/313 B |

(List continued on next page.)

FOREIGN PATENT DOCUMENTS

| 0 394 480 | 10/1990 | European Pat. Off. | H03H 9/145 |
| 0 530 041 | 3/1993 | European Pat. Off. | H03H 9/00 |
| 0 560 634 A1 | 9/1993 | European Pat. Off. | H03H 9/02 |
| 0 704 967 | 4/1996 | European Pat. Off. | H03H 9/145 |
| 43 30 438.9 | 3/1994 | Germany | H03H 9/145 |
| 2-44169 | 2/1990 | Japan | F25D 17/08 |
| 05328736 | 7/1995 | Japan | H03H 9/145 |

OTHER PUBLICATIONS

Proceedings of the Ultrasonics Symposium, Baltimore—Oct. 13–Nov. 3, 1993; vol. 1, Oct. 31, 1993, Levy M;Mcavoy BR, pp. 185–188, XP000473555, Lam C S et al: "A Low–Loss Saw Filter Using Two–Finger Per Wavelength Electrodes on The NSPUDT Orientation of Quartz", p. 185, left–hand col., line 41; p. 186, right–hand col., line 2.

Proceding of the Ultrasonics Symposium, Honolulu—Dec. 4–7, 1990; vol. 1, Dec. 4, 1990; Mcavoy B., pp. 43–48, XP000290032 Thorvaldsson T et al.: Low Loss Saw Filters Utilizing the Natural Single Phase UniDirectional Transducer (NSPUDT)—paragraph 2, paragraph 5.

Japanese Journal of Applied Physics, Supplements, vol. 30, No. Suppl. 30–1, Jan. 1, 1991, pp. 173–175, XP000305676 Yamanouchi K et al.: "Wide Bandwidth Low Loss Filters Using Piezoelectric Leaky Saw Unidirectional Transducers with Floating Electrodes"—paragraph 2.1; figure 1.

*Primary Examiner*—Thomas M. Dougherty
*Attorney, Agent, or Firm*—Parkhurst & Wendel

[57] ABSTRACT

A surface acoustic wave device including a piezoelectric substrate having NSPUDT behavior and a directionality reversed electrode structure including positive electrode, negative electrode and floating electrode. Positive and negative electrode fingers each having a width of $\lambda/8$ are arranged interdigitally at a pitch of $\lambda$ and floating electrode fingers having a width of $3\lambda/8$ are arranged between successive positive and negative fingers with an edge distance of $\lambda/8$. A directivity due to NSPUDT behavior of the substrate can be reversed. Positive and negative electrode fingers are arranged interdigitally at a pitch of $\lambda$ and between successive positive and negative electrode fingers are arranged floating electrode fingers having a reflecting coefficient different from that of the positive and negative electrodes.

21 Claims, 28 Drawing Sheets

U.S. PATENT DOCUMENTS

| | | | |
|---|---|---|---|
| 4,521,711 | 6/1985 | Okamoto et al. | 310/313 B |
| 4,818,961 | 4/1989 | Takahashi et al. | 310/313 D |
| 4,910,839 | 3/1990 | Wright | 310/313 B |
| 5,051,644 | 9/1991 | Wright | 310/313 B |
| 5,065,065 | 11/1991 | Hikita et al. | 310/313 B |
| 5,294,859 | 3/1994 | Yamanouchi et al. | 310/313 B |
| 5,434,465 | 7/1995 | Sato et al. | 310/313 A |
| 5,475,348 | 12/1995 | Hode et al. | 333/195 |
| 5,545,940 | 8/1996 | Wright | 310/313 D |
| 5,550,793 | 8/1996 | Dufilie | 310/313 R |

FIG_1
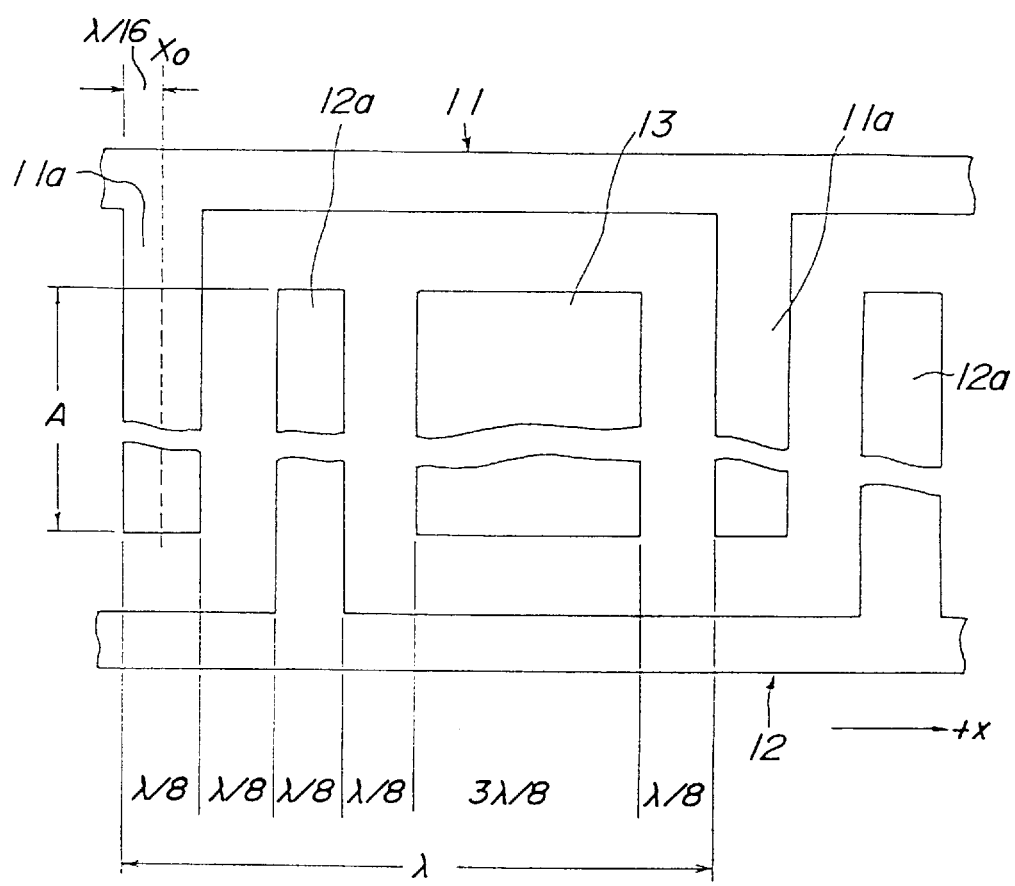

FIG_3
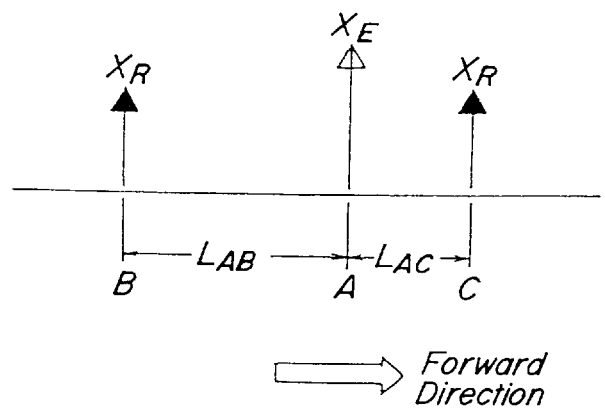

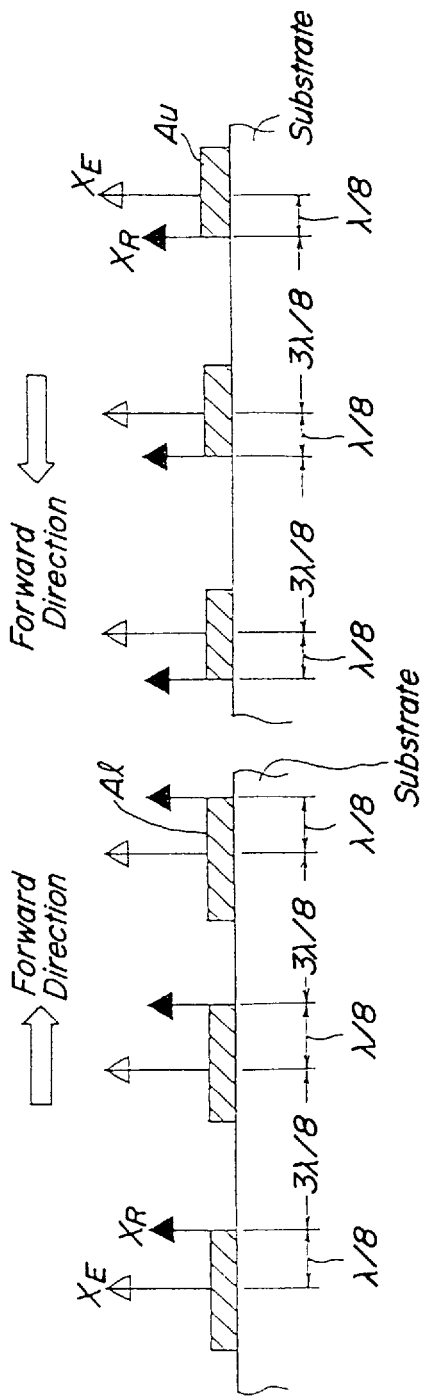

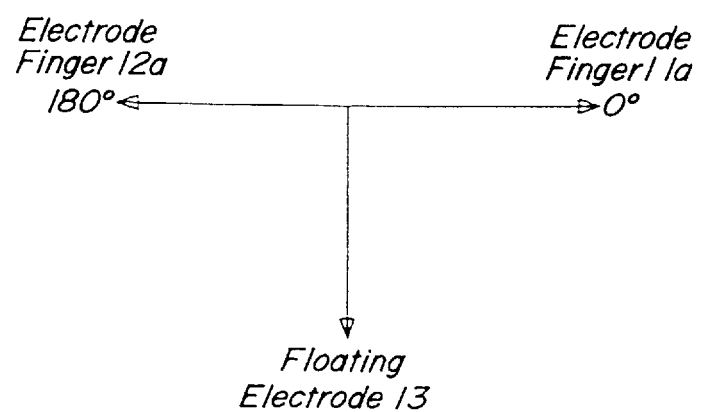
FIG_5

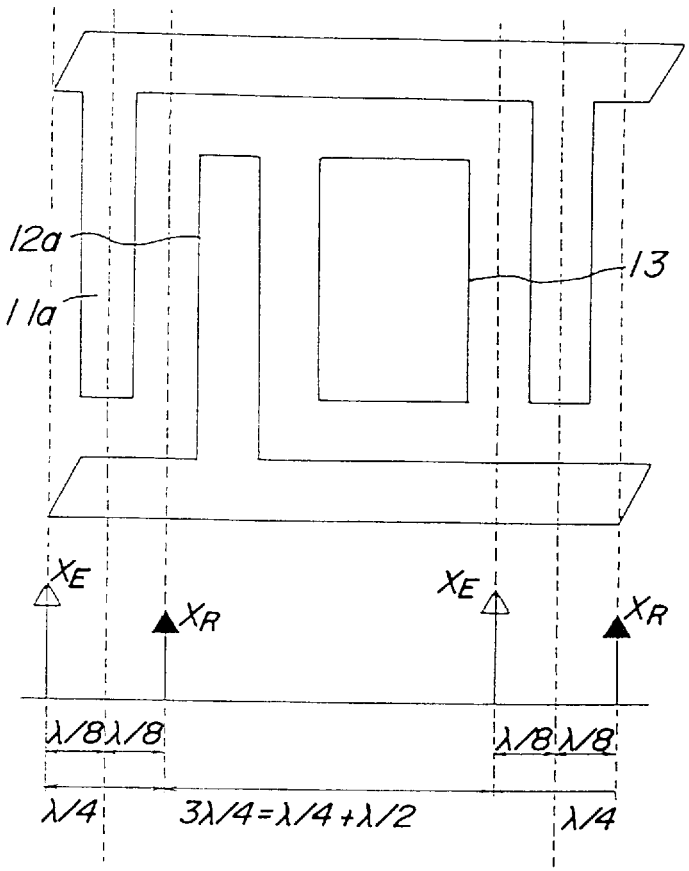
*FIG_6A*
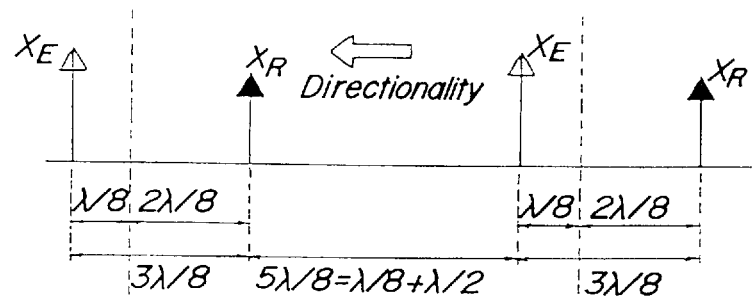
*FIG_6B*
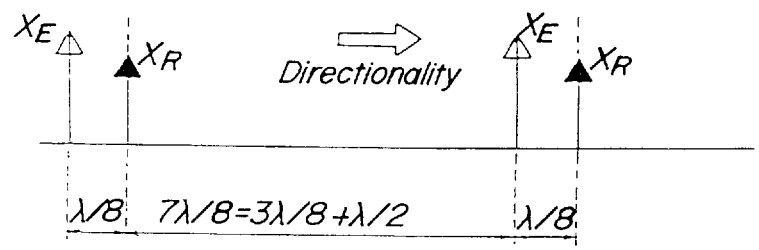
*FIG_6C*

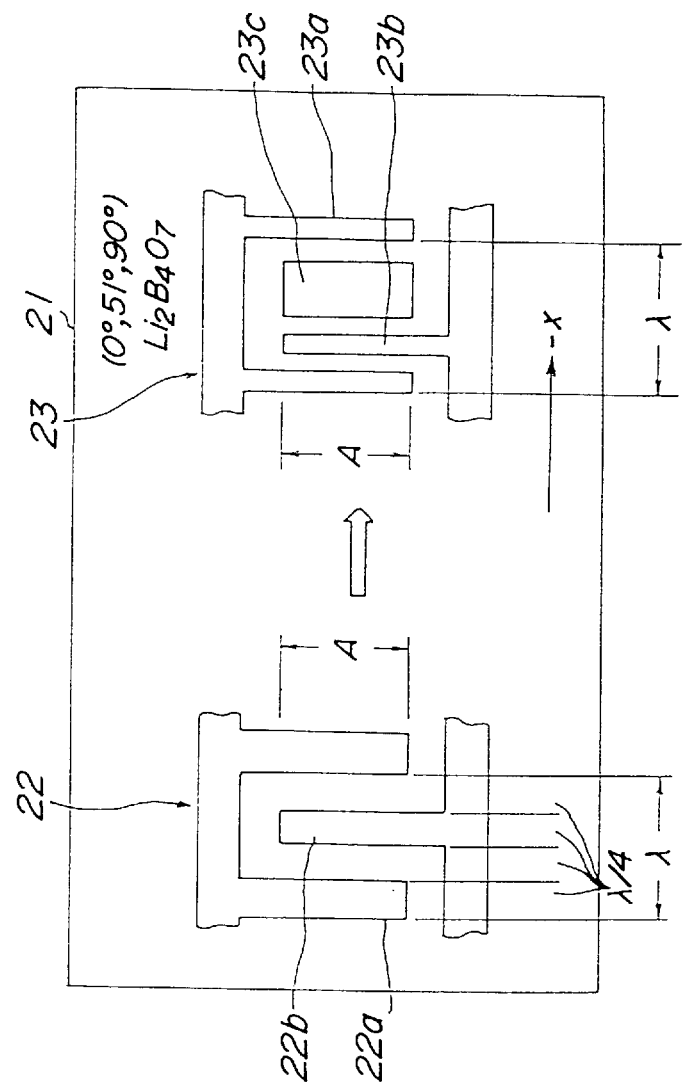

FIG_8
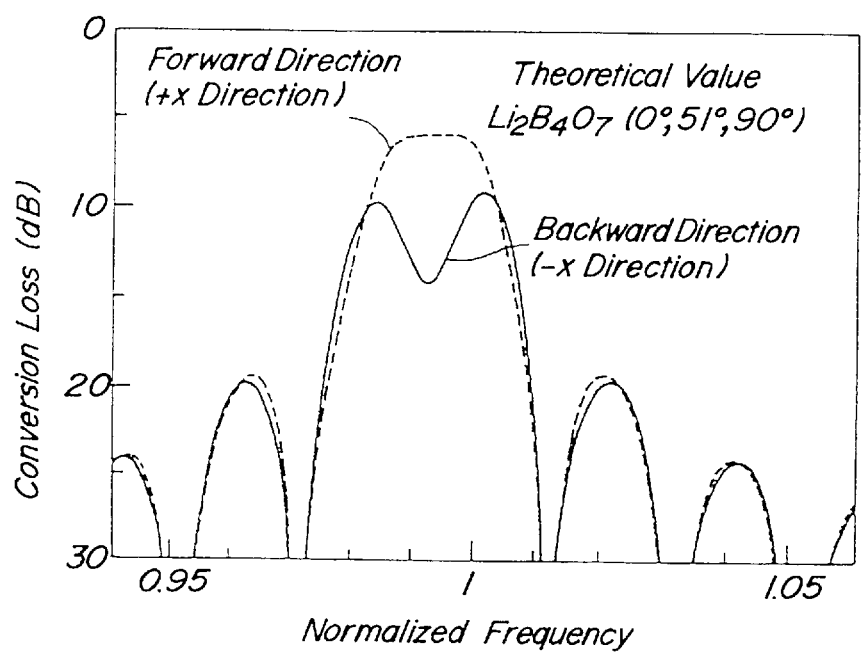

FIG_10

FIG_11

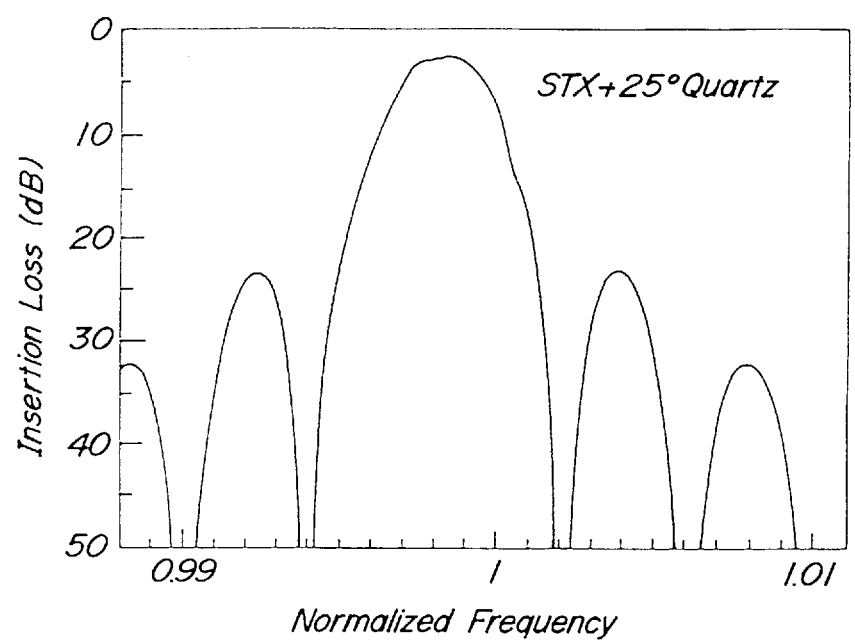
FIG_13

FIG_14
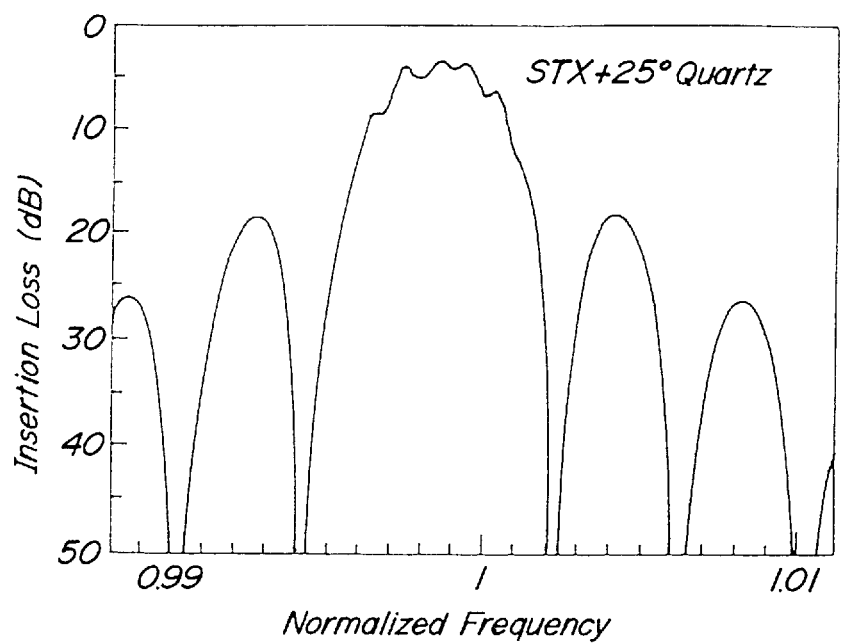

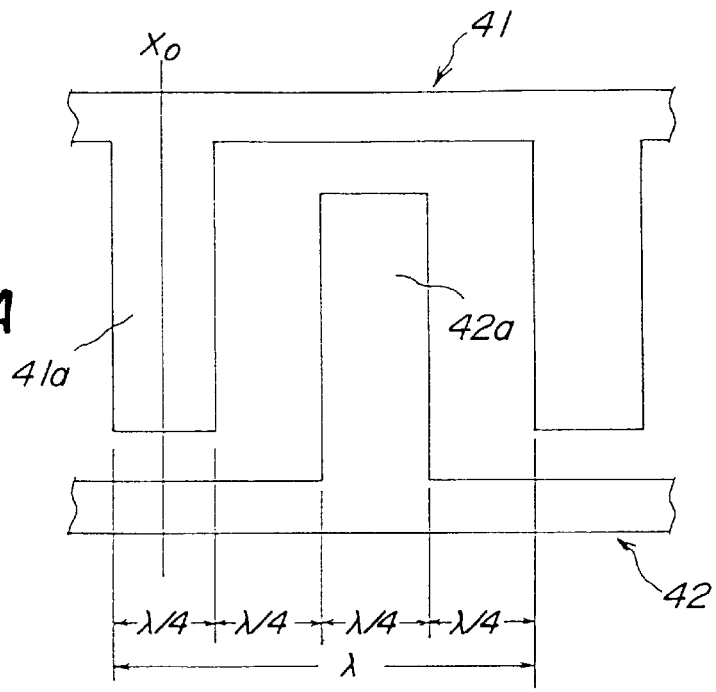
FIG.15A
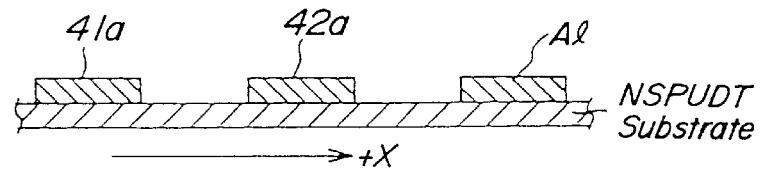
FIG.15B
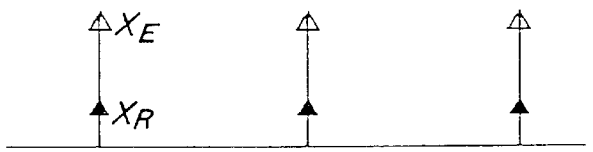
FIG.15C
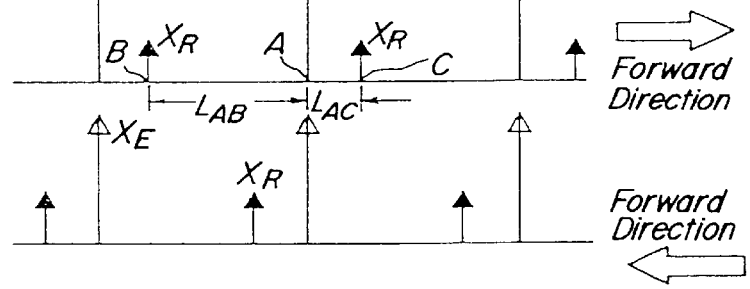
FIG.15D
FIG.15E

FIG_16
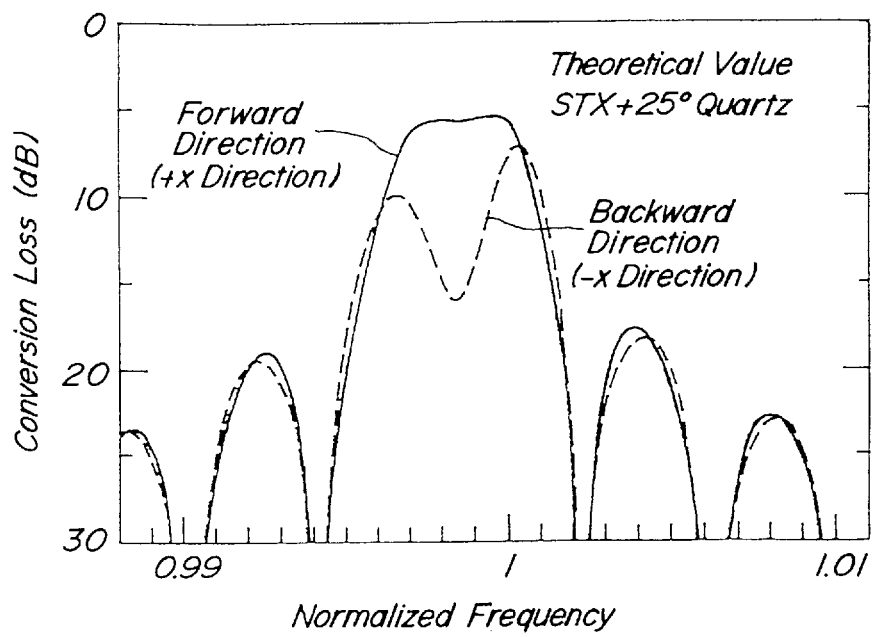
FIG_17
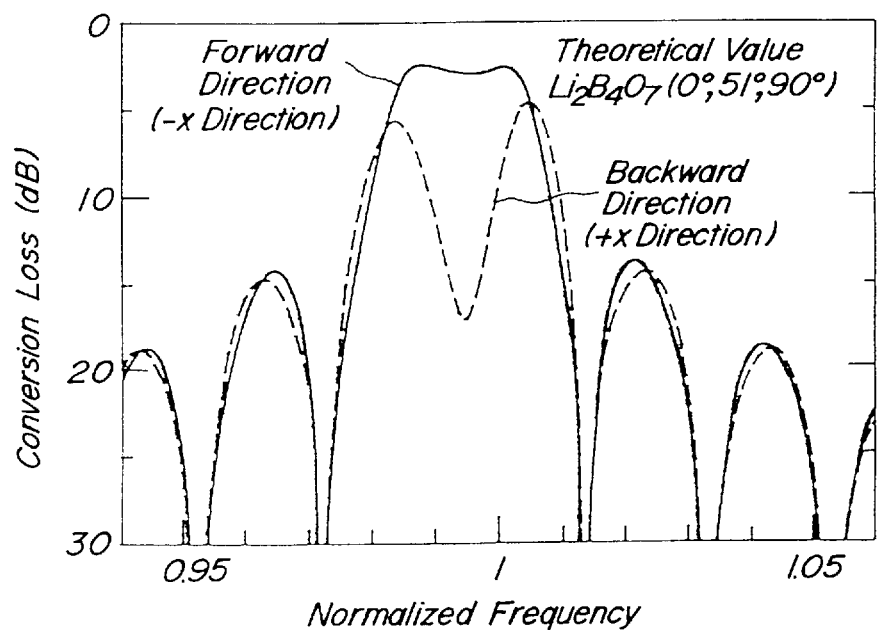

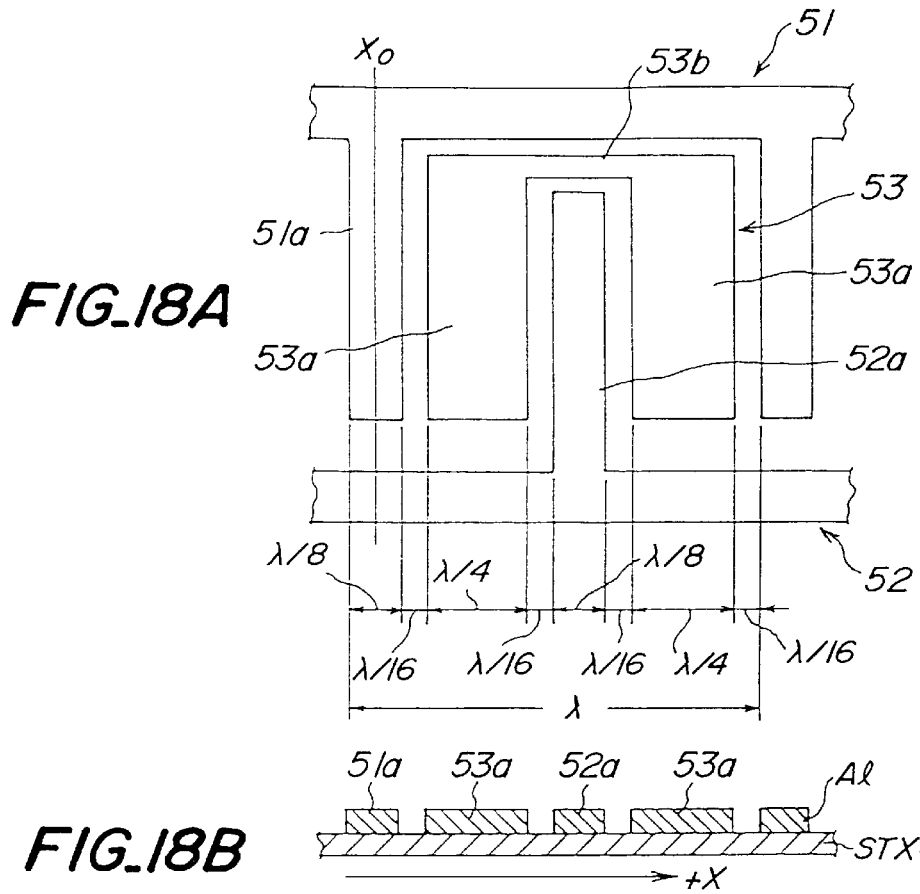
FIG_18A
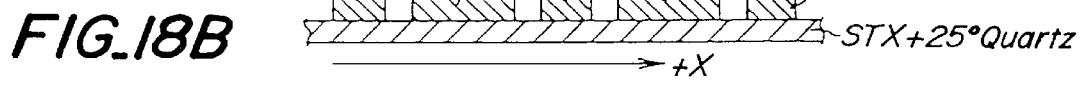
FIG_18B
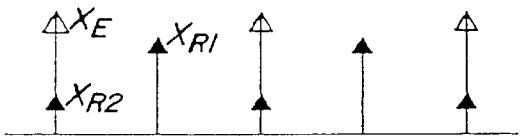
FIG_18C
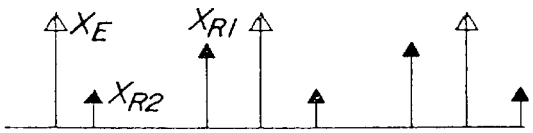
FIG_18D
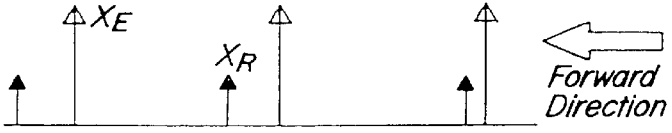
FIG_18E
$X_{R1} > X_{R2}, X_R = X_{R1} - X_{R2}$

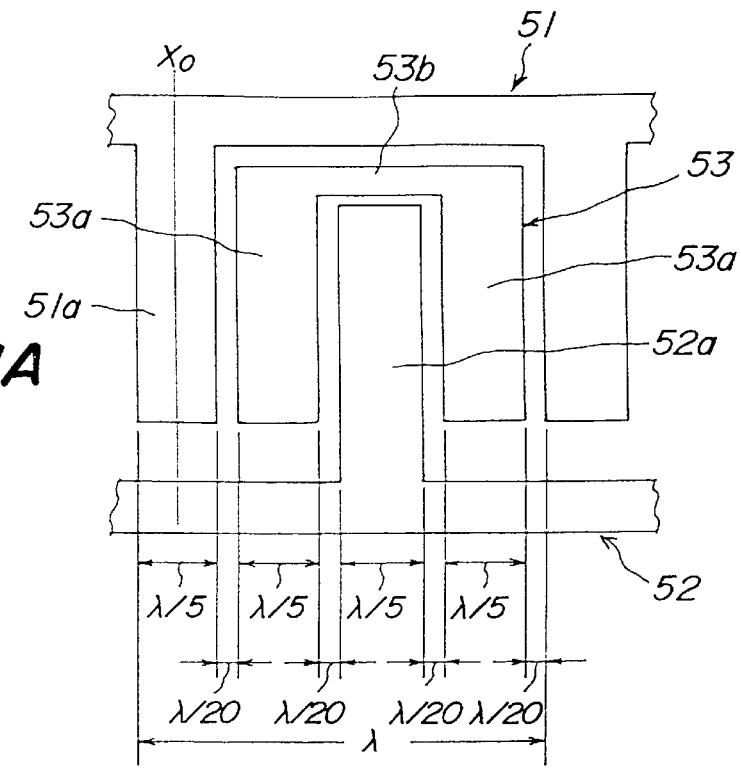
FIG._21A
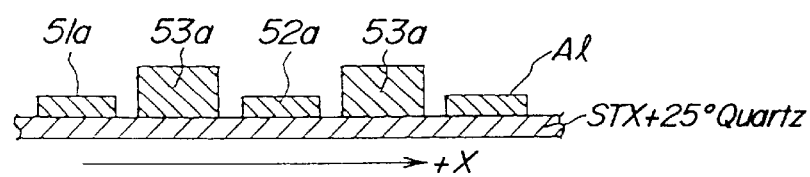
FIG._21B
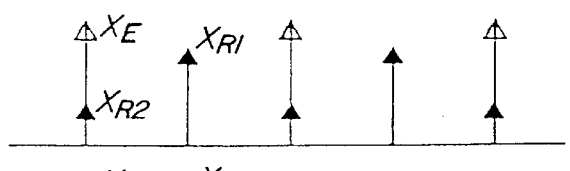
FIG._21C
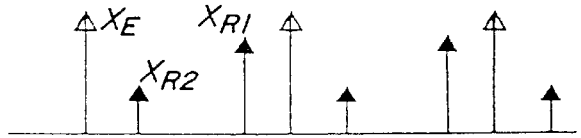
FIG._21D
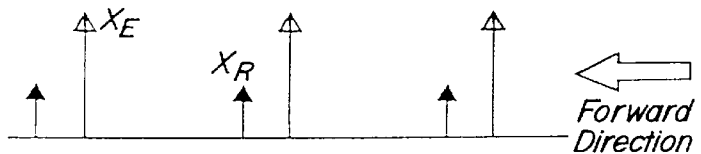
FIG._21E
$X_{R1} > X_{R2}, X_R = X_{R1} - X_{R2}$

FIG_22
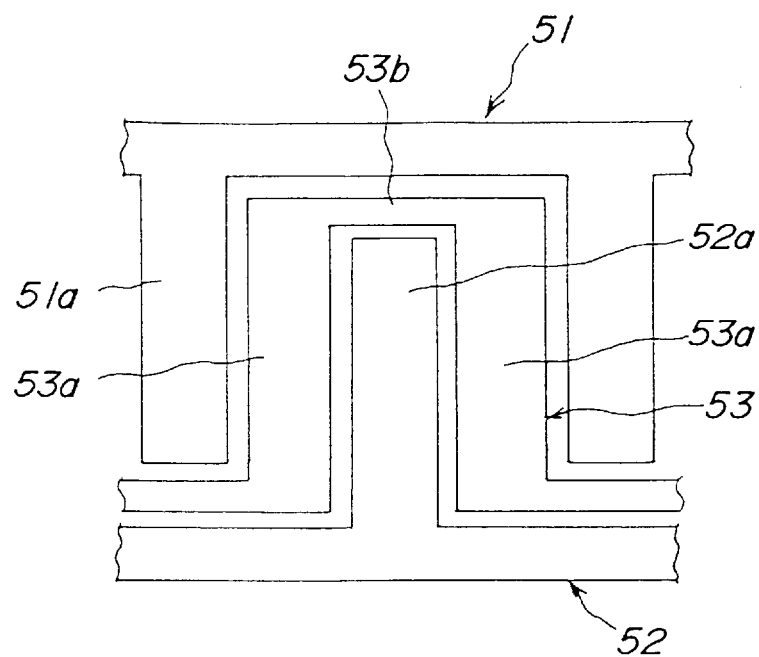
FIG_23
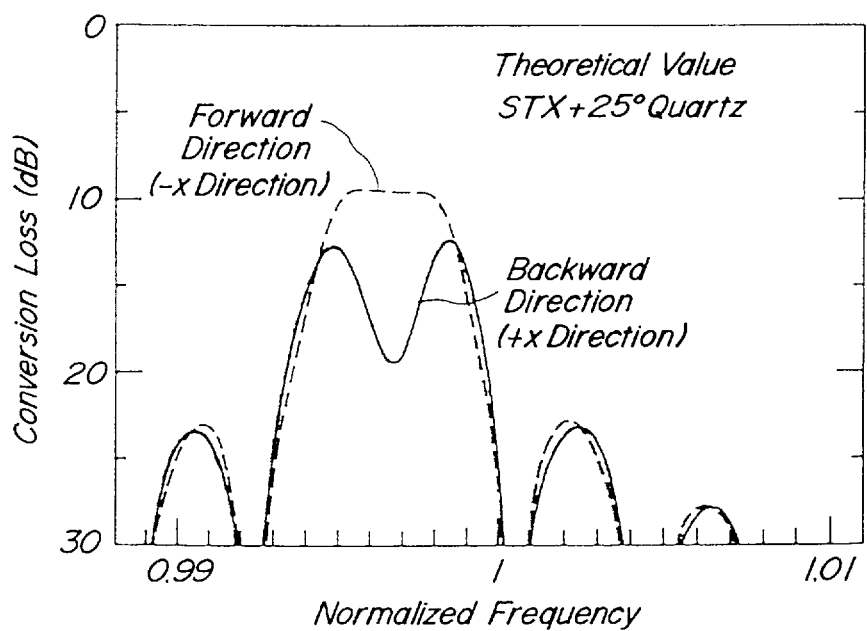

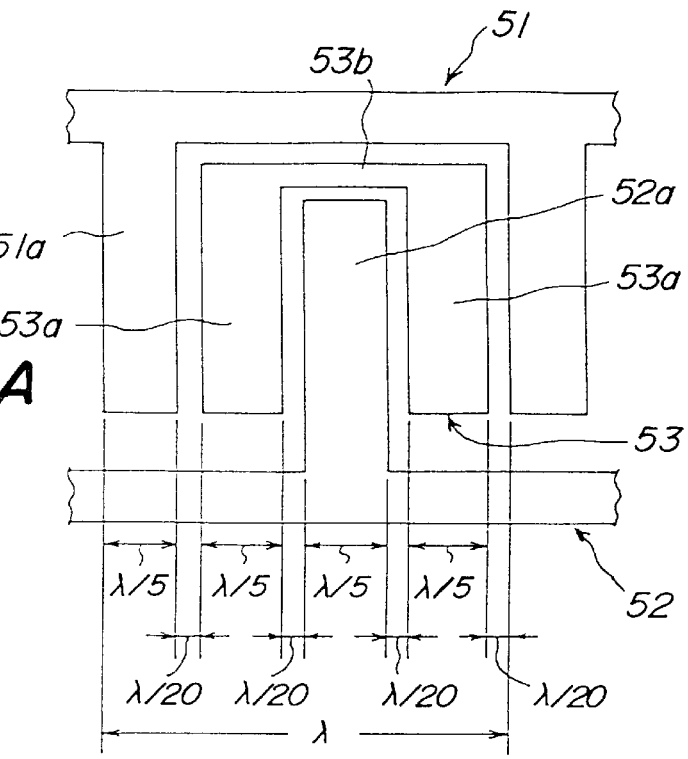
FIG. 24A
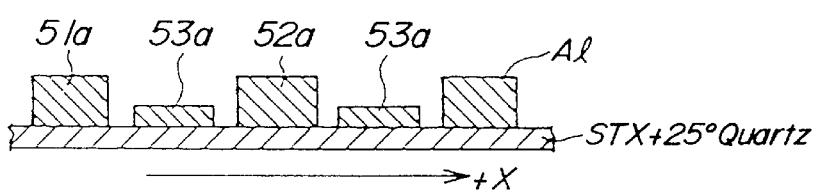
FIG. 24B
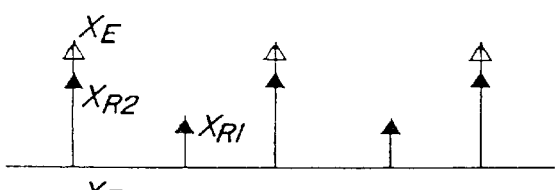
FIG. 24C
FIG. 24D
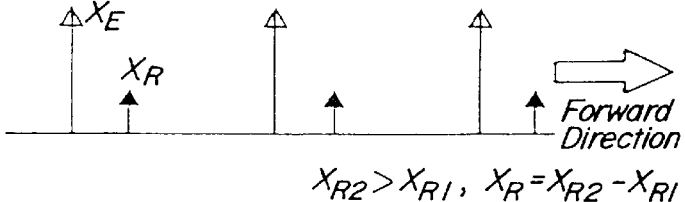
FIG. 24E
$X_{R2} > X_{R1}, \; X_R = X_{R2} - X_{R1}$

FIG_27
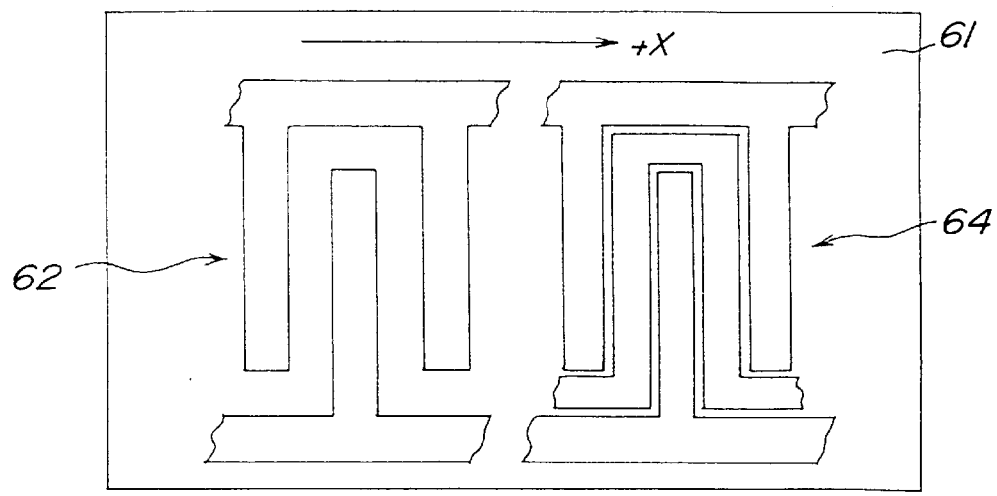
FIG_28
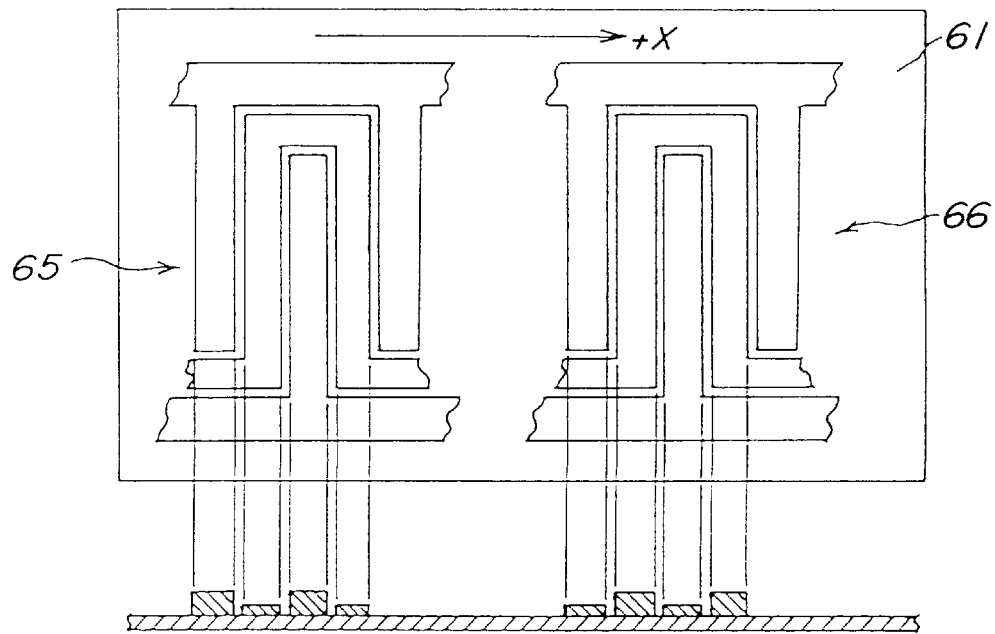

FIG_31
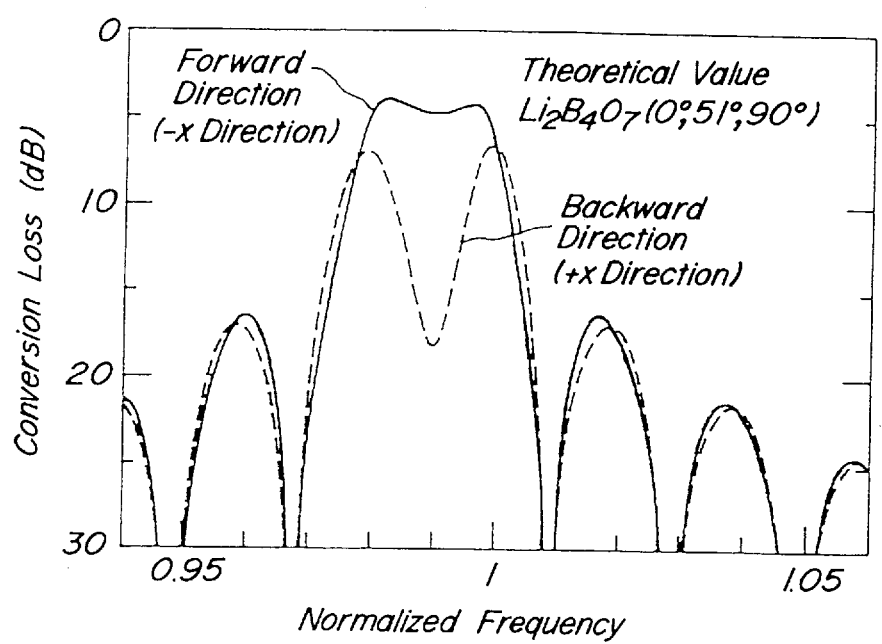

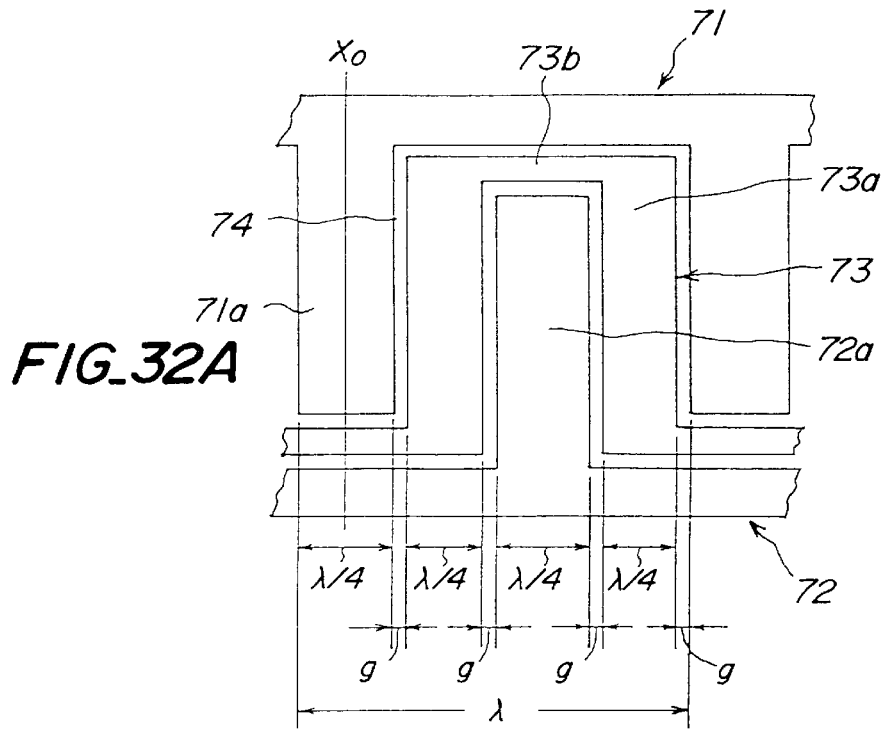
FIG_32A
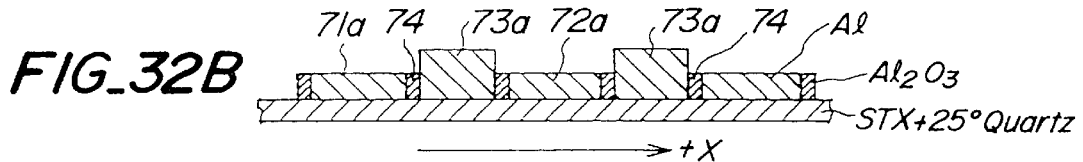
FIG_32B
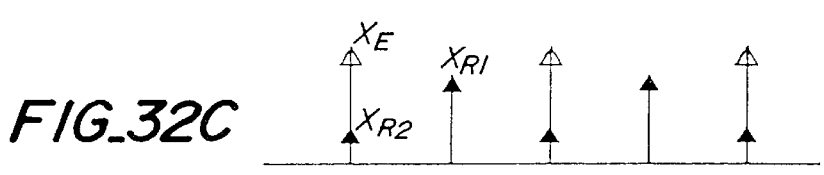
FIG_32C
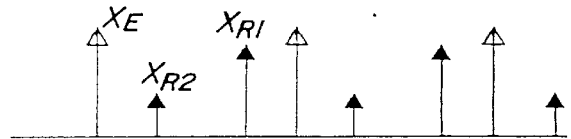
FIG_32D
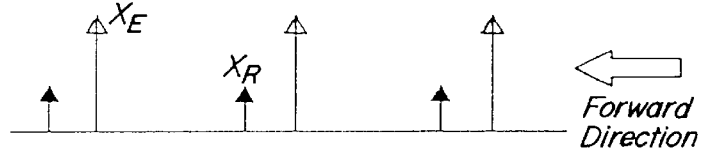
FIG_32E

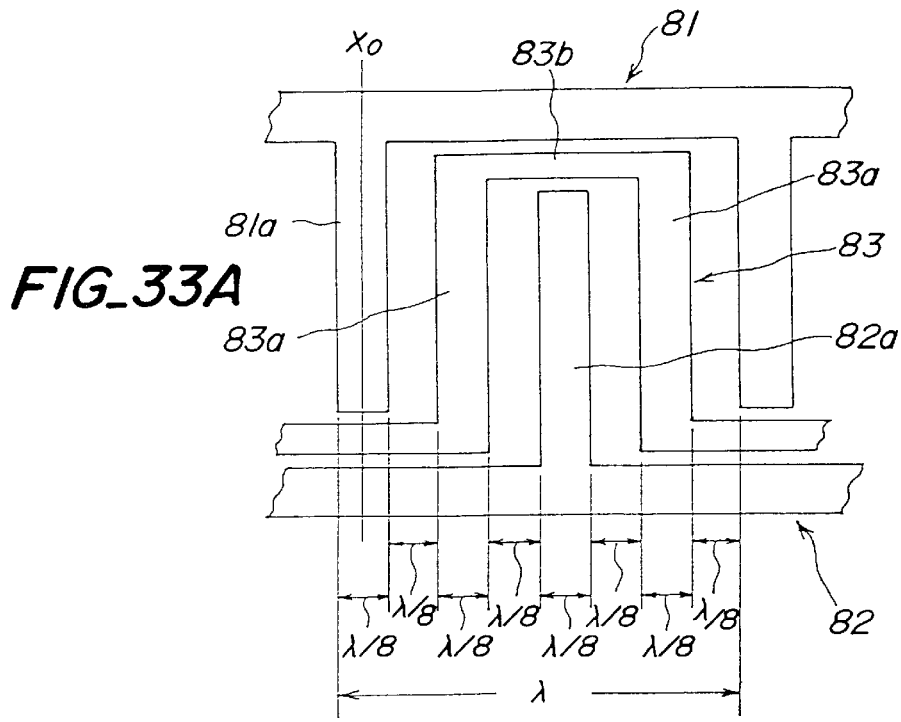
FIG_33A
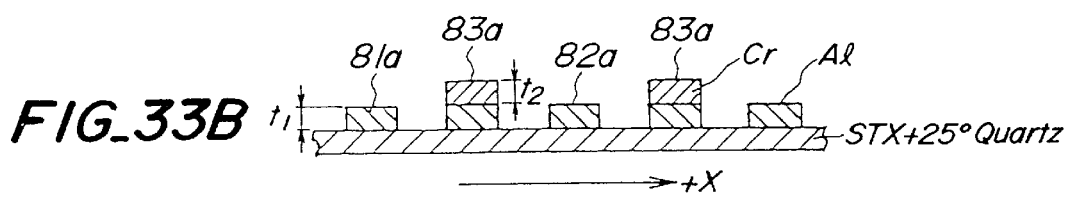
FIG_33B
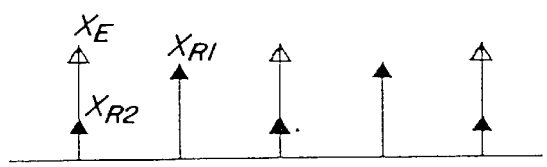
FIG_33C
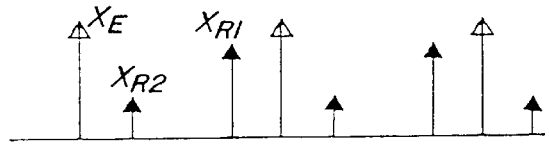
FIG_33D
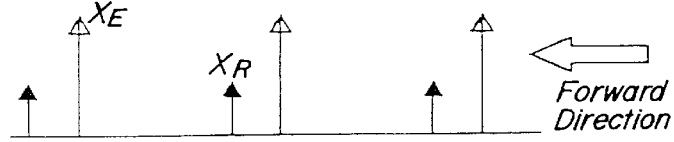
FIG_33E

SURFACE ACOUSTIC WAVE DEVICE

This is a Continuation on application Ser. No. 08/524,061 filed Sep. 6, 1995, now abandoned.

BACKGROUND OF THE INVENTION

1. Field of the Invention

The present invention relates to a surface acoustic wave device (SAW device) for use in or surface acoustic wave filter, or surface acoustic resonator and so and more particularly to a surface acoustic wave device utilizing a natural single-phase unidirectional transducer property.

2. Related Art Statement

As one of surface acoustic wave devices, there has been widely used a transversal type SAW filter, in which on a piezoelectric substrate there are arranged a transmitter side transducer including positive and negative electrodes which are arranged in an interdigital manner and are connected to 180° phase inverted output terminals of a signal source and a receiver side transducer including interdigitally arranged positive and negative electrodes.

In such a SAW filter, it is required to suppress an insertion loss and a ripple within a given frequency band as small as possible. When a usual electrode structure of interdigital type is used, the transducer is of a bidirectionality type, so that a theoretical insertion loss of 6dB is introduced and an insertion loss could not be made smaller than 6dB. In order to mitigate such a drawback, there has been proposed a multi-electrode structure (multi-transducer type), in which a plurality of receiver side transducers are arranged on both sides of each of a plurality of transmitter side transducers. In a SAW filter having such a multi-electrode structure, it is possible to decrease an insertion loss to about 1.5–2 dB. However, in such a SAW filter, it is very difficult to control the transducers and good phase and frequency characteristics could not be attained. Moreover, the multi-electrode structure can not be manufactured easily. In this respect, it should be noted that in order to improve the property of a SAW device, not only a small insertion loss, but also a flatness of phase characteristic and an improvement of a frequency characteristic such as a ripple within a pass band and a cut-off band have to be taken into consideration.

In order to satisfy the above mentioned requirements, there have been practically used unidirectional transducers which could realize a low insertion loss smaller than 1 dB as well as good phase and frequency characteristics. There have been proposed various kinds of unidirectional transducers and they may be roughly classified into (a) multi-phase unidirectional transducer and (b) single-phase unidirectional transducer. As the latter single-phase unidirectional transducer, there have been proposed various types such as a single-phase unidirectional transducer using an asymmetry in an electrode structure or an internal reflection due to a mechanical loading effect of electrode; a reflection bank type single-phase unidirectional transducer having a reflection bank arranged between exciting electrodes; a floating electrode type single-phase unidirectional transducer using a reflection due to a floating electrode; and a natural single-phase unidirectional transducer utilizing an anisotropy of a substrate. In these unidirectional transducers, the unidirectionality is obtained by a fact that phases of an exciting wave and a reflected wave become in-phase in a forward direction, but become opposite-phase in a backward direction.

In the single-phase unidirectional transducers other than the natural single-phase unidirectional transducer, the electrode structure becomes very complicated, and particularly a distance between adjacent edges of successive interdigital electrodes and a width of electrode fingers have to be smaller than $\lambda/4$, wherein $\lambda$ is a wavelength of a surface acoustic wave. Upon increasing an operating frequency said distance and width become very small, so that it would be rather difficult to manufacture an electrode structure precisely.

The natural single-phase unidirectional transducer (hereinafter called NSPUDT) has been proposed in which the above mentioned drawbacks can be mitigated. In NSPUDT, the unidirectionality can be attained by an anisotropy of a substrate itself, so that although a regular or normal type electrode structure in which electrode fingers having a width of $\lambda/4$ are arranged with an edge distance of $\lambda/4$ is used, it is possible to realize the unidirectionality. There have been known various piezoelectric substrates which show NSPUDT such as quartz substrate, $LiNbO_3$ substrate and $LiTaO_3$ substrate. The inventors have found that a lithium tetraborate substrate having special cut angles reveals good NSPUDT behavior. This lithium tetraborate substrate has a large electromechanical coupling constant $K^2$, a zero temperature coefficient of delay (TCD) and a zero power flow angle (PFA), so that there is a possibility to realize an ideal surface acoustic wave device.

In surface acoustic wave devices utilizing the above mentioned NSPUDT substrates, an anisotropy of the substrate itself is utilized, and thus there is a problem that unidirectional transducers having forward directions which face each other could not be easily provided as an output side or transmitter side transducer and an input side or receiver side transducer, respectively. In order to solve this problem, there have been proposed several methods. In one method, a directivity is reversed by making electrodes of one of the transducers of a material different from that of the other transducer, said material having a phase of a reflection coefficient which differs from that of an electrode material of the other transducer by 180°. In another method, recesses are formed in a surface of a substrate and electrodes are embedded within the recesses to reverse a directivity.

However, the known solutions result in a complication in designing and manufacturing, so that a surface acoustic wave device is liable to be expensive. Moreover, it is rather difficult to attain a desired precision, and thus desired frequency and phase characteristics could not be obtained easily.

In Japanese Patent Application Laid-open Publication Kokai Hei 5-347535, there is proposed a unidirectional electrode structure for STX quartz substrate having no NSPUDT. This known electrode structure is based on $\lambda/12$ for electrode width and edge distance, and thus it requires a very precise working. Recently, an operating frequency has increased, so that a size of the electrode structure has to be also reduced and a manufacturing process becomes difficult.

SUMMARY OF THE INVENTION

The present invention has for its object to provide a novel and useful surface acoustic device, which can remove or at least mitigate the above mentioned drawbacks of the known surface acoustic wave devices using NSPUDT behavior, can have good frequency and phase characteristics and can be manufactured easily and precisely.

According to a first aspect of the invention, a surface acoustic wave device comprises:

a piezoelectric substrate having such cut angles that the substrate reveals a natural single-phase unidirectional transducer behavior; and a directionality reversed electrode structure having a basic structure in which positive and negative electrode fingers each having a width of about $\lambda/8$, $\lambda$ being a wavelength of a surface acoustic wave, are arranged successively with an edge distance of about $\lambda/8$ and floating electrode fingers each having a width of about 3 $\lambda/8$ are arranged with an edge distance of about $\lambda/8$ with respect positive electrode fingers, wherein $\lambda$ is a wavelength of a surface acoustic wave and said positive and negative electrode fingers are connectable to two terminals of a signal source or a load having 180° phase difference.

In the surface acoustic wave device according to the first aspect of the invention, the transmitter side and receiver side electrode structures can be made of a same electrode material and the electrode width and edge distance are based on a size of $\lambda/8$, and therefore the electrode structure can be manufactured easily and precisely and desired NSPUDT behavior can be attained.

In the surface acoustic wave device according to the invention, the construction of the directionality reversed electrode structure may be modified such that a position of a floating electrode finger may be shifted in a propagating direction of the surface acoustic wave in accordance with a substrate material and cut angles. For instance, when a lithium tetraborate substrate of (0°, 78°, 90°) orientation is used, the floating electrode fingers may be shifted by about $2\lambda/56$ in order to correct a deviation of a directivity.

Furthermore, the width and edge distance of electrode fingers allow a tolerance of ±10% due to a possible error in precise machining.

According to a second aspect of the invention, a surface acoustic wave device comprises:
  a piezoelectric substrate having such cut angles that the substrate reveals a natural single-phase unidirectional transducer behavior; and
  an electrode structure including positive and negative electrode fingers arranged alternately with a pitch of $\lambda$ while a distance between centers of successive positive and negative electrode fingers is about $\lambda/2$, and floating electrode fingers each being arranged between successive positive and negative electrode fingers and having a reflection coefficient which is different from that of the positive and negative electrode fingers, wherein $\lambda$ is a wavelength of a surface acoustic wave and said positive and negative electrode fingers are connectable to two terminals of a signal source or a load having 180° phase difference.

In the surface acoustic wave device according to the second aspect of the invention, the positive and negative electrode fingers are arranged interdigitally and floating electrode fingers having a different reflection coefficient than that of the positive and negative electrode fingers are arranged between successive positive and negative electrode fingers, so that a directivity can be attained. When the floating electrode fingers and positive and negative electrode fingers are made of a same material, the electrode structure may be easily manufactured by a single precise process. Although when the floating electrodes are made of a material different from a material of the positive and negative electrode fingers, the electrode structure may be easily manufactured by selectively etching a laminated electrode film consisting of different material films by using an electrochemical effect, which has been developed by the inventors of the present invention.

According to the invention, within each electrode pairs, it is preferable to arrange two floating electrodes symmetrically with respect to the positive and negative electrode fingers, but such a symmetrical arrangement is not always required and an asymmetrical arrangement may be adopted in order to correct a deviation of a directivity.

In a preferable embodiment of the surface acoustic wave device according to the second aspect of the invention, a width of said positive and negative electrode fingers is about $\lambda/8$ and said floating electrode fingers have a width of about $\lambda/4$ and are arranged between successive positive and negative electrode fingers with an edge distance of about $\lambda/16$.

In another preferable embodiment of the surface acoustic wave device according to the second aspect of the invention, a width of said positive and negative electrode fingers is about $\lambda/8$ and said floating electrode fingers are arranged between successive positive, negative electrode fingers such that edges of the floating electrode fingers are opposed to edges of the positive and negative electrode fingers with interposing therebetween very narrow gaps of air or dielectric material, and said floating electrode fingers are formed by a metal film made of a same material as that of the positive and negative electrode fingers, but having a different thickness than that of the positive and negative electrode fingers or are formed by a laminated metal film including a metal film made of a different material than that of the positive and negative electrode fingers.

In another preferable embodiment of the surface acoustic wave device according to the second aspect of the invention, a width of said positive and negative electrode fingers is about $\lambda/5$ and said floating electrode fingers are arranged between successive positive, negative electrode fingers such that edges of the floating electrode fingers are opposed to edges of the positive and negative electrode fingers with interposing therebetween very narrow gaps of air or dielectric material, and said floating electrode fingers are formed by a metal film made of a same material as that of the positive and negative electrode fingers, but having a different thickness than that of the positive and negative electrode fingers or are formed by a laminated metal film including a metal film made of a different material than that of the positive and negative electrode fingers.

In another preferable embodiment of the surface acoustic wave device according to the second aspect of the invention, a width of said positive and negative electrode fingers is about $\lambda/8$, said floating electrode fingers have a width of about $\lambda/8$ and are arranged between successive positive and negative electrode fingers with an edge distance of about $\lambda/8$, and said floating electrode fingers are formed by a metal film made of a same material as that of the positive and negative electrode fingers, but having a different thickness than that of the positive and negative electrode fingers or are formed by a laminated metal film including a metal film made of a different material than that of the positive and negative electrode fingers.

According to the invention, the piezoelectric substrate having NSPUDT behavior may be formed by various piezoelectric substrates such as a quartz substrate of STX+25° cut, a quartz substrate of Euler angles (45°, 55°, 0°) cut, a lithium tantalate substrate (LiTaO$_3$) of YZ +51.25° cut, a lithium niobate substrate (LiNbO$_3$) of Y- $\theta$= cut ($\theta$=25°–45°), a lithium niobate substrate of 128° rotated Y cut and a lithium tetraborate substrate (Li$_2$B$_4$O$_7$) having cut angles represented by Euler angles ($\psi$, $\theta$, $\phi$) of $\psi$=+5°—5°, $\theta$=9°–29° and 32°–86° and $\phi$=85°–95°.

BRIEF DESCRIPTION OF THE DRAWINGS

FIG. 1 is a plan view showing the directionality reversed electrode structure used in the surface acoustic wave device according to the invention;

FIG. 3 is a schematic view explaining a principle of revealing the directivity;

FIGS. 4A and 4B are schematic views denoting the exciting and reflecting centers in a combination of NSPUDT substrate and normal type electrode structure:

FIG. 5 is a schematic view showing reflection phases of electrode fingers of the electrode structure shown in FIG. 1 on a substrate without NSPUDT behavior;

FIGS. 6A, 6B and 6C show the construction and operation of the directionality reversed electrode structure according to the invention;

FIG. 7 is a plan view illustrating a first embodiment of the surface acoustic wave device according to the first aspect of the invention:

FIG. 8 is a graph representing a conversion loss of the directivity reversed electrode shown in FIG. 7;

FIG. 13 is a graph representing an insertion loss of the SAW device shown in FIG. 12;

FIG. 14 is a graph an insertion loss of a known SAW filter:

FIGS. 15A–15E show the construction and operation of the normal type electrode structure;

FIG. 16 is a graph representing a conversion loss of a SAW device having the normal electrode structure formed on STX+25° cut quartz substrate;

FIG. 17 is a graph showing a conversion loss of a SAW device having the normal electrode structure formed on a lithium tetraborate substrate;

FIGS. 18A–18E illustrate the construction and operation of a first embodiment of the SAW device according to the second aspect of the invention;

FIGS. 21A–21E show the construction and operation of a third embodiment of the SAW device according to the second aspect of the invention;

FIG. 22 is a plan view depicting the electrode structure of a fourth embodiment of the SAW device according to the second aspect of the invention;

FIG. 23 is a graph representing a conversion loss of the SAW device shown in FIGS. 21 and 22;

FIGS. 24A–24E show the construction and operation of a fifth embodiment of the SAW device according to the second aspect of the invention;

FIG. 27 is a plan view depicting a SAW filter including the SAW device illustrated in FIG. 22;

FIG. 28 is a plan view showing a SAW filter having the SAW devices depicted in FIGS. 21 and 24;

FIG. 31 is a graph showing a conversion loss of an eighth embodiment of the SAW device according to the second aspect of the invention;

FIGS. 32A–32E show the construction and operation of a ninth embodiment of the SAW device according to the second aspect of the invention;

FIGS. 33A–33E show the construction and operation of a tenth embodiment of the SAW device according to the second aspect of the invention.

DESCRIPTION OF THE PREFERRED EMBODIMENTS

Figures 2A, 2B:
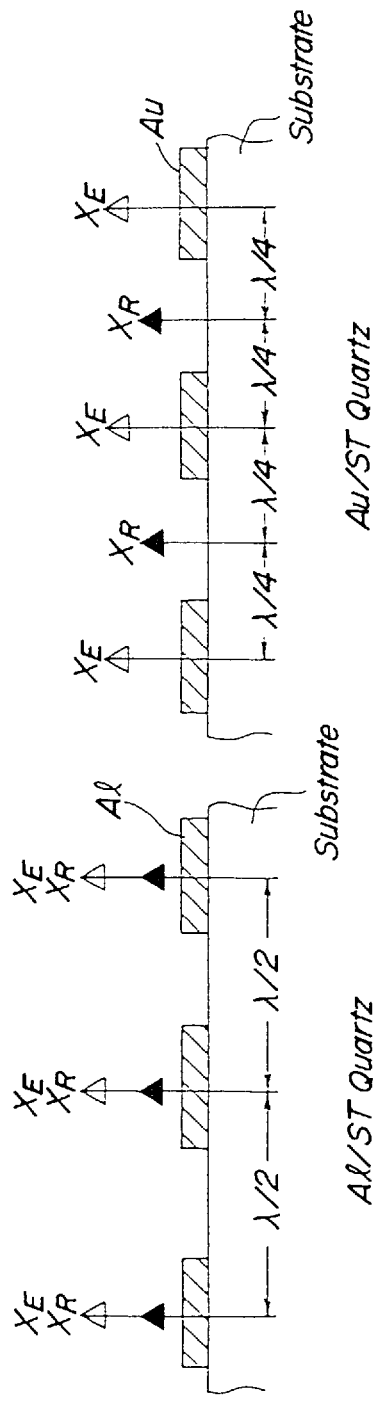
FIGS. 2A and 2B are schematic views representing exciting and reflecting centers of the normal type electrode structure on a substrate without NSPUDT behavior.

FIG. 1 is a plan view showing a basic construction of the directionality reversed electrode structure of the surface acoustic wave device according to the invention. A positive electrode 11 comprises electrode fingers 11a each having a width of $\lambda/8$ and arranged at a pitch of $\lambda$, and a negative electrode 12 includes electrode fingers 12a each having a width of $\lambda/8$ and arranged at a pitch of $\lambda$. The positive electrode fingers 11a and negative electrode fingers 12a are arranged in an interdigital manner with an edge distance of $\lambda/8$ viewed in a propagating direction of a surface acoustic wave. In the directionality reversed electrode structure according to the invention, between successive positive and negative electrode fingers 11a and 12a are arranged floating electrode fingers 13 having a width of 3 $\lambda/8$ with an edge distance of $\lambda/8$ with respect to adjacent positive and negative electrode fingers. An aperture length A may be 200 $\lambda$ for lithium tetraborate substrate, said aperture length being defined as a length of portions of positive and negative electrode fingers 11a and 12a which are overlapped with each other viewed in the propagating direction of the surface acoustic wave. Now a function of the directionality reversed electrode structure will be explained.

FIGS. 2A and 2B illustrate exciting centers and reflecting centers of surface acoustic waves in SAW devices in which generally used regular or normal type electrode structures made of aluminum and gold, respectively on a usual piezoelectric substrate having no NSPUDT behavior, e.g. ST cut quartz substrate. A white arrow denotes an exciting center and a black arrow represents a reflecting center. Now it is assumed that a reflection coefficient $r_0$ may be expressed as follows:

$$r_0 = |r_0| e^{-j\ 90°}$$

In this normal type electrode structure, there is no difference in phase between an excited surface acoustic wave and a reflected surface acoustic wave in either right and left directions, so that a directivity does not occur.

FIG. 3 shows a principle of the single-phase unidirectional transducer. Now it is assumed that exciting center $X_E$ and reflecting center $X_R$ are relatively shifted by a distance $L_{AB} = 3\lambda/8 + n\lambda/2$ and a distance $L_{AC} = \lambda/8 + n\lambda/2$ (n=0, 1, 2 - - - ) as shown in FIG. 3. Then, a propagating distance of a surface acoustic wave reflected by a reflecting center $X_R$ in a right direction shown by an arrow may be derived as (3λ/8+nλ/2) =2+λ/4=λ+nλ(n=0, 1, 2 - - - ) while a reflection phase is taken into consideration, so that the rightwardly reflected surface acoustic wave becomes in-phase with a surface acoustic wave emanating from an exciting center $X_E$ in a right hand direction. Similarly, a propagating distance of a surface acoustic wave reflected by a right hand reflecting center into a left direction is (λ/8+nλ/2)+2+λ/4=λ/2+nλ, and thus the leftwardly reflected surface acoustic wave becomes opposite in phase to a surface acoustic wave emanating from an exciting center $X_E$ in a left hand direction. In this manner, the surface acoustic waves propagating in the left hand direction are cancelled out, while the surface acoustic waves propagating in the right hand direction are enhanced.

FIG. 4 shows a principle of an operation of a device in which a regular or normal type electrode structure is provided on an STX +25° quartz substrate having NSPUDT behavior which can be used in the surface acoustic wave device according to the invention. In the case of using a piezoelectric substrate having NSPUDT behavior, reflection centers $X_R$ are shifted in a right hand direction by λ/8 due to an anisotropy of the NSPUDT substrate as compared with the example shown in FIG. 2. If the reflecting centers XR of the normal type electrode structure made of aluminum shown in FIG. 2A are shifted rightwardly, there is introduced a directivity in the right hand direction as shown in FIG. 4A in accordance with the principle explained above with reference to FIG. 3. When the reflecting centers $X_R$ of the normal type electrode structure made of gold shown in FIG. 2B are shifted rightwardly due to the NSPUDT behavior of the substrate, there is introduced a directivity in the left hand direction as shown in FIG. 4B. In this manner, in the STX +25° substrate, although a direction of the reflecting center shift is same, a sign of the reflection coefficient becomes opposite for aluminum and gold, so that opposite directivities can be obtained.

Therefore, by of using NSPUDT substrates in the present invention, it is possible to realize a desired operating property by providing normal type electrode structures including aluminum electrodes and gold electrodes on the substrate to be opposed to each other. However, when the electrode structures on the same substrate are made of different materials, a manufacturing process are complicated, yield is low and a cost is increased. Furthermore, in some substrates, signs of reflection coefficient for aluminum and gold electrode structures are identical to each other. According to the first aspect of the invention, it is possible to use electrode structures made of a same material. That is, if the electrode structure having the exciting center $X_E$ and reflecting center $X_R$ relatively shifted by λ/4 for the substrate having no NSPUDT behavior as shown in FIG. 2B is made of only aluminum, the directivity in the left hand direction may be obtained when the reflecting center is shifted rightward due to the NSPUDT behavior like the case of FIG. 4B, said directivity being opposite to that of FIG. 4A. According to the invention, the directionality reversed electrode structure illustrated in FIG. 1 is designed on the basis of the above mentioned principle.

When the electrode structure shown in FIG. 1 is provided on a substrate having no NSPUDT behavior, $X_R$ =λ/8, $X_E$=-λ/8 and $X_R$_$X_E$=λ/4, while a position $x_0$ is taken as a reference. In this manner, an electrode structure equivalent to that shown in FIG. 2B is realized. That is, when the center position $x_o$ of the positive electrode finger 11a is taken as a reference plane for the reflection, a phase diagram of three electrodes becomes as shown in FIG. 5, and a total reflection coefficient viewed from the center position $x_0$ of electrode may be expressed as follows:

$$r = r_0 e^{-j90°} = |r_0| e^{-j180°}$$

This is equivalent to a fact that the reflecting center is shifted rightward by λ/8. The floating electrode fingers 13 is completely isolated from the exciting electrode, and thus a field distribution of an exciting potential becomes asymmetrical and the exciting center $X_E$ is shifted.

FIG. 6 is a schematic view representing a positional relationship between the exciting center $X_E$ and reflecting center $X_R$ in the electrode structure according to the invention. FIG. 6A denotes positions of the exciting center and reflecting center for a usual substrate such as STX cut quartz substrate having no NSPUDT behavior. From a distribution of a fundamental wave of a field distribution, it is seen that a position of the exciting center is shifted by -λ/8 with respect to the center position of the positive electrode finger 11a. Furthermore, from the total reflection coefficient, it can be seen that a position of the reflecting center $X_R$ is shifted by λ/8 with respect to the center $X_0$ of the positive electrode finger 11a. This condition corresponds to the case of FIG. 2B. That is, the directivity does not occur and a bidirectionality appears. FIG. 6B shows a case in which the electrode structure is provided on a substrate having NSPUDT behavior such as STX +25° cut quartz substrate. A position of the exciting center is not changed, but the reflecting center is shifted rightward by λ/8 due to NSPUDT behavior of the substrate, so that a directionality oriented in the left hand direction can be attained.

FIG. 6C illustrates a case using a lithium tetraborate substrate of (0°, θ, 90°) (θ=32°–86°) cut. Due to NSPUDT behavior of the substrate, the direction of shift is opposite to the case of STX +25° and the reflecting center is shifted leftward by λ/8, and there is obtained a directionality in the right hand direction in FIG. 6C.

FIG. 7 is a plan view showing a first embodiment of the surface acoustic wave device according to the invention constructed as a SAW filter using a surface acoustic wave having a wavelength λ of 15 μm.

In the present embodiment, use is made of a lithium tetraborate ($Li_2B_4O_7$) substrate 21 of Euler cut angles (ψ, θ, φ)=(0°, 51°, 90°) providing an ideal NSPUDT behavior. On a surface of this substrate 21 there are arranged transmitter side transducer 22 and receiver side transducer 23 made of an aluminum film having a thickness of 0.37μm. The transmitter side transducer 22 is formed by a normal type electrode structure of λ/4 including positive electrode fingers 22a and negative electrode fingers 22b having a width of λ/4, i.e. 15/4 μm and being interdigitally arranged with an edge distance of λ/4. The number of electrode pairs is 50. An aperture length A is 200λ, i.e. 15 ×200 μm.

The receiver side transducer 23 is formed by the directionality reversed electrode structure shown in FIG. 1. This directionality reversed electrode structure includes positive and negative electrode fingers 23a and 23b having a width of λ/8 and being arranged at a pitch of λ with an edge distance of λ/8 and floating electrodes 23c are inserted between successive negative electrode fingers 23b and positive electrode fingers 23a with an edge distance of λ/8. An aperture length A of the directionality reversed electrode structure of the receiver side transducer 23 is also 200λ. In FIG. 7, only one period of the electrode structures of the transmitter side transducer 22 and receiver side transducer 23 is shown for the sake of clearness.

FIG. 8 represents a conversion loss of the directionality reversed electrode structure of the receiver side transmitter 23 in the present embodiment. By using the directionality reversed electrode structure as the receiving side transmitter, the surface acoustic wave transmitted by the transmitter side transducer 22 formed by the normal type electrode structure can be efficiently received, so that it is possible to provide a SAW filter having small insertion loss and ripple as well as a good phase characteristic.

Figure 9:
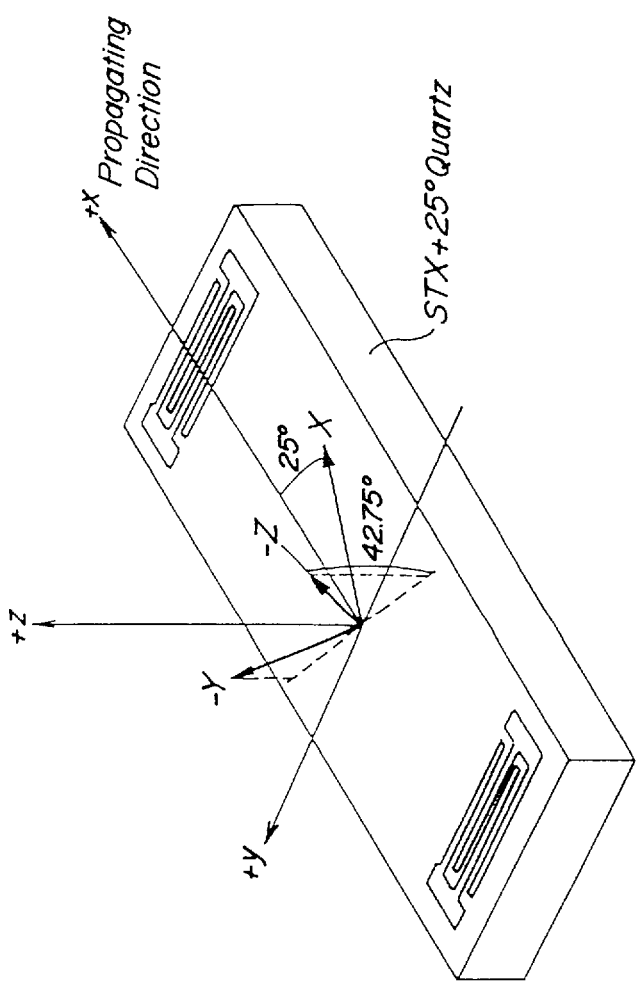
FIG. 9 is a perspective view explaining a relationship between crystal axes and coordinates on a substrate.
Figure 10:
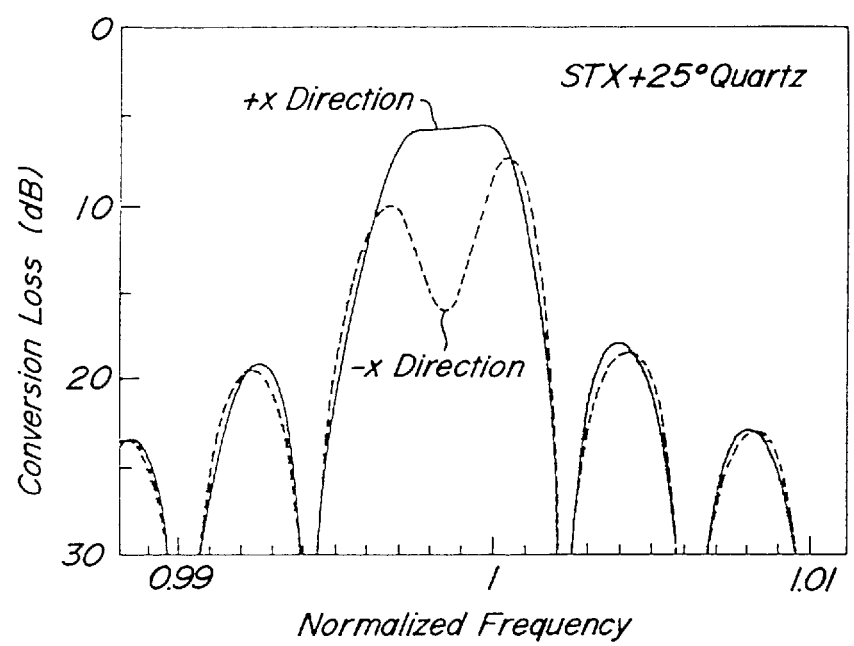
FIG. 10 is a graph showing a conversion loss of the SAW device having the normal type electrode structure on STX+25° cut quartz substrate.
Figure 11:
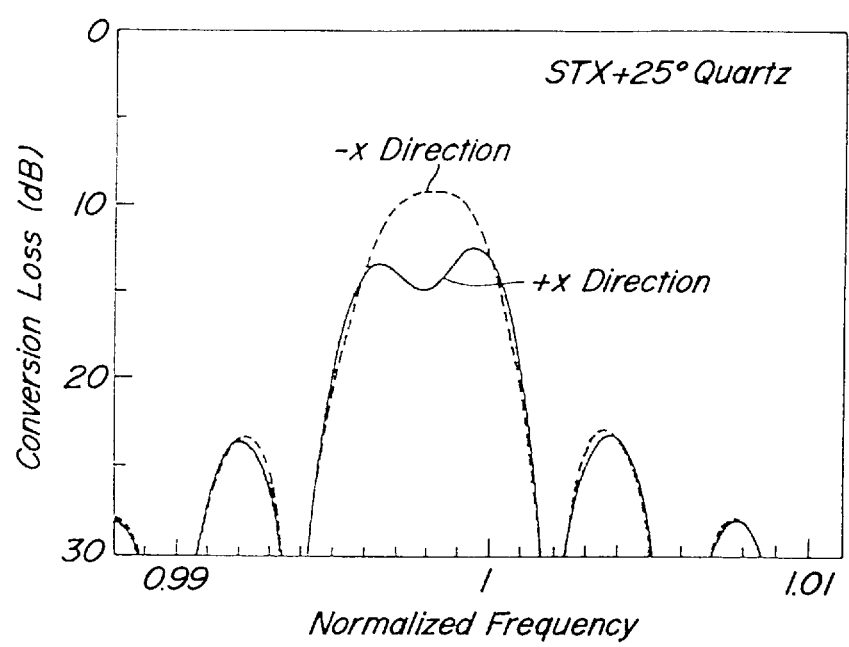
FIG. 11 is a graph showing a conversion loss of the SAW device having the directionality reversed electrode structure on STX+25° cut quartz substrate according to the invention.

FIG. 9 is a schematic view representing a relationship between crystal axes and substrate coordinates of an STX +25° cut quartz substrate having NSPUDT behavior. FIG. 10 is a graph showing an conversion loss of a device in which a normal type electrode structure of $\lambda/4$ is provided on such a quartz substrate, and FIG. 11 is a graph illustrating an conversion loss of a device according to the invention, in which the directionality reversed electrode structure is arranged on an STX +25° cut quartz substrate having NSPUDT behavior. In these graphs, a solid line denotes a conversion loss in +xdirection and a broken line represents a conversion loss in −xdirection. Upon comparing these graphs, it can be seen that according to the invention, the directivity is reversed by a combination of the the electrode structure shown in FIG. 1 and NSPUDT behavior of the substrate.

Figure 12:
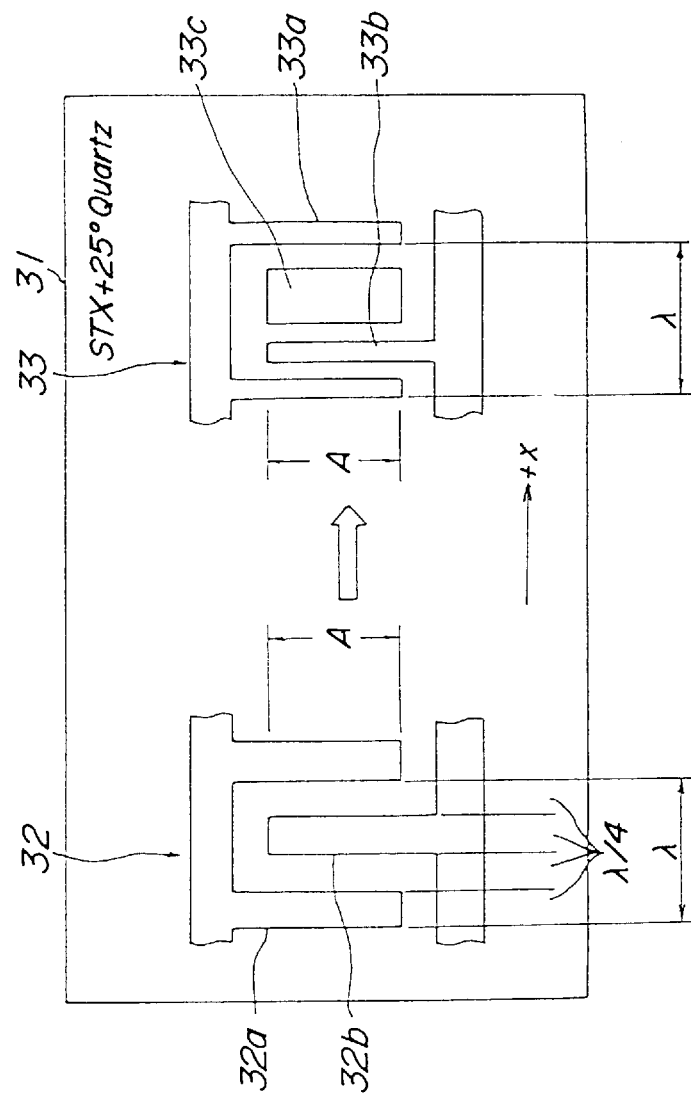
FIG. 12 is a plan view depicting a second embodiment of the SAW device according to the invention.

FIG. 12 is a plan view illustrating a second embodiment of the surface acoustic wave device according to the invention. In the present embodiment, a SAW filter is constructed by an STX +25° cut quartz substrate 31, a transmitter side transducer 32 formed by a normal type electrode structure of $\lambda/4$ and a receiver side transducer 33 formed by a directionality reversed electrode structure. The transmitter side transducer 32 and receiver side transducer 33 have the entirely same construction as the transducers 22 and 23 of the first embodiment shown in FIG. 7.

FIG. 13 is a graph showing a theoretical insertion loss of the SAW filter of the present embodiment. FIG. 14 illustrates an insertion loss of a known SAW filter in which on an STX +25° cut quartz substrate, there are provided a normal type electrode structure as the transmitter side transducer and a double electrode structure of $\lambda/8$ as the receiver side transducer. By comparing these graphs, it is apparent that according to the invention there is substantially no ripple within a given frequency band and an insertion loss is very small.

FIGS. 15A is a plan view showing a normal type electrode structure of $\lambda/4$ provided on an STX +25° cut quartz substrate or a lithium tetraborate substrate of cut angles (0°, 51°, 90°) having NSPUDT behavior, and FIG. 15B is a cross sectional view thereof. A positive electrode 41 comprises electrode fingers 41a having a width of $\lambda/4$ and being arranged at a pitch of $\lambda$ and a negative electrode 42 includes electrode fingers 42a having a width of $\lambda/4$ and being arranged at a pitch of $\lambda$. The positive and negative electrode fingers 41a and 42a are arranged interdigitally with and edge distance of $\lambda/4$ viewed in a propagating direction of a surface acoustic wave. These electrode fingers 41a and 42a are made of aluminum.

FIG. 15C shows positions of exciting centers and reflecting centers of a surface acoustic wave when a normal type electrode structure made of generally used aluminum is formed on a usual piezoelectric substrate having no NSPUDT behavior. It should be noted that FIG. 15c corresponds to FIG. 2A. As explained above with reference to FIG. 2A, a white arrow $X_E$ denotes the exciting center and a black arrow represents the reflecting center of the electrode finger. In the case of the normal type electrode structure, the positions of the exciting center and reflecting center are identical, so that the directivity does not occur in either right hand direction and left hand direction.

FIG. 15D shows positions of exciting center and reflecting center of a case in which the normal type electrode structure is formed on an STX +25° cut substrate and FIG. 15E represents positions of exciting center and reflecting center of a case in which the normal type electrode structure is arranged on a lithium tetraborate substrate of (0°, θ, 90°) (θ=32°–86°). In FIG. 15D, the reflecting center $X_R$ is shifted rightwardly with respect to the exciting center $X_E$ by $\lambda/8$ so that $L_{AB}=3\lambda/8$ and $L_{AC}=\lambda/8$. Therefore, the directivity in the right hand direction is obtained as has been described above with reference to FIG. 4A. In FIG. 15E, there is obtained a directivity in the left hand direction as has been explained with reference to FIG. 4B.

FIG. 16 is a graph showing a conversion loss of a SAW device, in which the normal electrode structure of $\lambda/4$ is provided on the STX +25° cut quartz substrate having NSPUDT behavior. A frequency on an axis of abscissa is normalized by a center frequency of the surface acoustic wave transducer. An aperture length A is 250λ and the number of electrode pairs is 250. A conversion loss is theoretically calculated by a simulation while 250 pairs of split electrode structures are used as monitor electrodes.

FIG. 17 is a graph showing a conversion loss of a SAW device using the above mentioned lithium tetraborate substrate having NSPUDT behavior. A conversion loss is theoretically calculated under a condition that an aperture length A is 200λ and the number of electrode pairs is 50.

As explained above, when the piezoelectric substrate having NSPUDT behavior is used, it is possible to realize the directivity by using the normal type electrode structure. In case of constructing a SAW device such as a SAW filter, it is necessary to provide a surface acoustic wave transducer which can reverse the directivity obtained by NSPUDT. Surface acoustic wave transducers having opposite directivities may be realized by making the transducers of different electrode materials such as aluminum and gold by utilizing a plurality of precise processes. However, in this case the manufacturing process becomes complicated and a yield is liable to be decreased due to misalignment of pattern. Therefore, the SAW device is liable to be expensive. Moreover, reflection coefficients for aluminum and gold are identical to each other for some substrates, so that the above solution could not be adopted.

In general, a reflection coefficient per electrode pair is changed in accordance with substrate material, electrode material, and electrical conditions, thickness and width of electrodes. This has been described in "Theses of the Acoustic Society of Japan", March 1985, pp. 645–646. On the basis of such recognition, the second aspect of the present invention can provide a novel directionality reversed electrode structure which can be advantageously used in combination of piezoelectric substrates having NSPUDT behavior.

FIGS. 18A and 18B are plan and cross sectional views, respectively showing a first embodiment of the surface acoustic wave device according to the second aspect of the invention. In the present embodiment, on an STX +25° cut quartz substrate, there are arranged a directionality reversed electrode structure comprising positive electrode 51, negative electrode 52 and floating electrode 53 is provided. Positive electrode fingers 51a and negative electrode fingers 52a are arranged at a pitch of $\lambda$ and have a width of $\lambda/8$. The positive electrode fingers 51a and negative electrode fingers 52a are arranged interdigitally such that a distance between centers of successive positive and negative electrode fingers is about $\lambda/2$. The floating electrode 53 includes floating electrode fingers 53a having a width of about $\lambda/4$ and each of the floating electrode fingers is interposed between successive positive electrode finger 51a and negative electrode finger 52a with an edge distance of about $\lambda/16$. Within an electrode pair, two floating electrode fingers 53a are connected to each other by means of a bridge portion 53b. All the positive and negative electrodes 51 and 52 and floating electrode 53 are made of aluminum and have a same thickness as shown in FIG. 18B.

FIG. 18C denotes positions of exciting and reflecting centers for a SAW device in which the above mentioned electrode structure shown in FIGS. 18A and 18B is provided on a piezoelectric substrate having no NSPUDT behavior. FIG. 18D shows positions of exciting and reflecting centers of the SAW transducer of the present embodiment. As shown in FIGS. 18C and 18D, there appear two reflecting centers $X_{R1}$ and $X_{R2}$. In the present embodiment, a width of the floating electrode 53a is wider than that of the positive and negative electrode fingers 51a and 52a as illustrated in FIG. 18A. Then, reflection coefficients have a relationship of $X_{R1} > X_{R2}$. In FIG. 18E, these two reflecting centers are represented by a single reflecting center $X_R (= X_{R1} - X_{R2})$ FIG. 18E is equivalent to FIG. 15E. The SAW transducer of the present embodiment reveals a directivity in the left direction.

Figure 19:
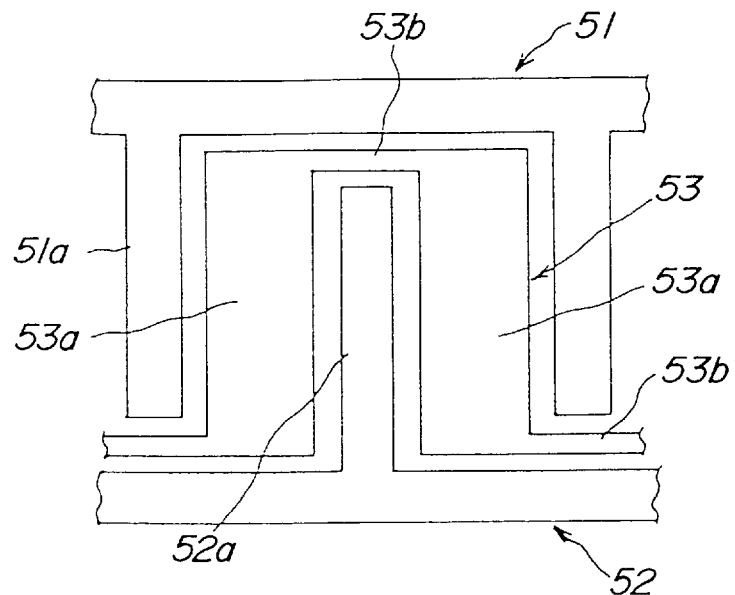
FIG. 19 is a plan view depicting the electrode structure of a second embodiment of the SAW device according to the second aspect of the invention.

FIG. 19 is a plan view illustrating a second embodiment of the SAW device according to the second aspect of the invention. Upon compared with the first embodiment shown in FIG. 18, the construction of the floating electrode 53 is modified. That is, in the first embodiment, the first floating electrode finger 53a arranged between the positive finger and the negative finger viewed in the propagating direction of the surface acoustic wave and the second floating electrode finger 53b arranged between the negative finger 52a and the positive finger 51a also viewed in the propagating direction of the surface acoustic wave are couple with each other by the bridge portion 53b, but the floating electrodes 53 in successive electrode pairs are not connected to each other. In the present embodiment, all the floating electrode fingers 53a are connected to each other via the bridge portions 53b. That is, all the floating electrodes 53 are shortcircuited.

In the surface acoustic wave transducer according to the invention, centers of successive floating electrode fingers 53a are separated by λ/2, so that potentials on successive floating electrode fingers 53a coupled with each other are cancelled out and become zero potential. Therefore, operating characteristics of the opened floating electrodes showing FIG. 18A are substantially identical with those of the shortcircuited floating electrodes illustrated in FIG. 19. It should be noted that all floating electrode fingers 53b may be formed as an opened type.

Figure 20:
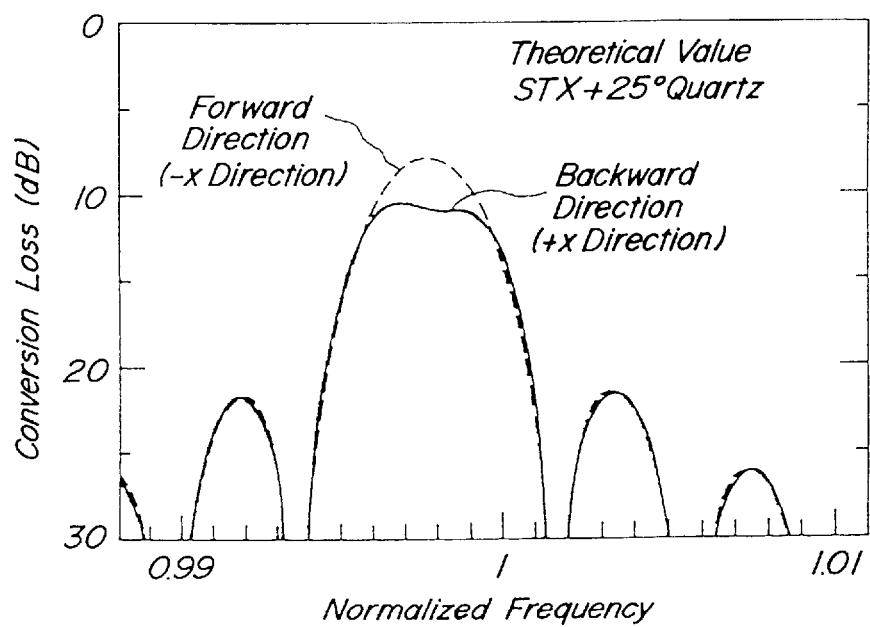
FIG. 20 is a graph denoting a conversion loss of the SAW device shown in FIGS. 18 and 19.

FIG. 20 is a graph showing a conversion loss of the first and second embodiments of the surface acoustic wave device according to the invention. A conversion loss is theoretically calculated under conditions that the number of electrode pairs is 250, an aperture length A is 250 λ, and all the electrodes are formed by an aluminum film having a thickness of 0.01 λ. In FIG. 20, -x direction is the forward direction which is opposite to that of the case shown in FIG. 16.

FIGS. 21A and 21B are plan and cross sectional views, respectively showing a third embodiment of the surface acoustic wave device according to the second aspect of the invention. In the present embodiment, fingers 51a of a positive electrode 51 and fingers 52a of a negative electrode 52 have a width of about λ/5 and are arranged at a pitch of about λ such that centers of successive positive and negative electrode fingers 51a and 52a are separated from each other by a distance of λ/2. Fingers 53a of a floating electrode 53 have a width of about λ/5 and are arranged symmetrically between successive positive fingers 51a and negative fingers 52a with an edge distance of about λ/20. The two floating electrode fingers 53a within an electrode pair are coupled with each other by means of a bridge portion 53b. Since gaps between the positive and negative electrode fingers 51a and 52a and the floating electrode fingers 53a are very small such as λ/20, this type of the electrode structure is called a narrow gap type.

In the present embodiment, a thickness of the floating electrode fingers 53a is larger than a thickness of the positive and negative electrode fingers 51a and 52a as illustrated in FIG. 21B, and all the electrodes are made of aluminum. Then, $X_{R1} > X_{R2}$, and therefore a directivity in the left hand direction can be attained as illustrated in FIG. 21E. It should be noted that FIGS. 21C and 21D correspond to FIGS. 18C and 18D, respectively.

It should be noted that if the floating electrode 53 is made of a material whose reflection coefficient differs from that of the positive and negative electrodes 51 and 52, a similar result could be obtained.

FIG. 22 is a plan view depicting a fourth embodiment of the surface acoustic device according to the second aspect of the invention. In the present embodiment, all the floating electrode fingers 53b are connected with each other by means of the bridge portions 53b. The remaining construction of the present embodiment is similar to the third embodiment shown in FIGS. 21A and 21B. As explained above, in the present invention the floating electrode fingers 53a are arranged symmetrically, and thus operating characteristics of the fourth embodiment shown in FIG. 22 is substantially identical with those of the second embodiment illustrated in FIG. 20.

FIG. 23 shows a conversion loss of the third and fourth embodiments depicted in FIGS. 21 and 22. A conversion loss is theoretically calculated under conditions that the number of pairs is 250, an aperture length A is 250 λ, a thickness of the positive and negative electrodes 51 and 52 is 0.01 λ, and a thickness of the floating electrode 53 is 0.02 λ. Also in the present embodiment, the directivity is obtained such that the forward direction is -x direction. Like as the first and second embodiments shown in FIGS. 18 and 19, the directivity is reversed.

FIGS. 24A and 24B are plan and cross sectional views, respectively showing a fifth embodiment of the surface acoustic wave device according to the second aspect of the present invention. The present embodiment differs from the fourth embodiment shown in FIG. 21 in a point that a thickness of the positive and negative electrodes 51 and 52 is larger than a thickness of the floating electrode 53 as shown in FIG. 24B. Then, the reflecting coefficients have a relationship of $X_{R2} > X_{R1}$. Therefore, a directivity becomes opposite as shown in FIG. 24E. That is, the directivity in the right hand direction like the normal type electrode structure of λ/4 shown in FIG. 15D. It should be noted that the electrode structure of the present embodiment could not be utilized in combination with the normal type electrode structure, but may be advantageously used together with the electrode structures of the third and fourth embodiments shown in FIGS. 21 22.

When the normal type electrode structure of λ/4 is used together with the directionality reversed electrode structure illustrated in FIGS. 21 and 22 to form a SAW filter, a materialized surface area of the normal type electrode structure is different from one of the directionality reversed electrode structure, and thus it would be difficult to make coincident center frequencies of these electrode structures. However, when the electrode structure of the present embodiment is combined with the electrode structure shown in FIGS. 21 and 22, surface areas of these electrode structures become equal to each other and center frequencies of these electrode structures can be easily made coincident with each other. It should be noted that all the floating electrode fingers 53a may be connected to each other by the bridge portions 53b like the embodiments illustrated in FIGS. 19 and 22.

Figure 25:
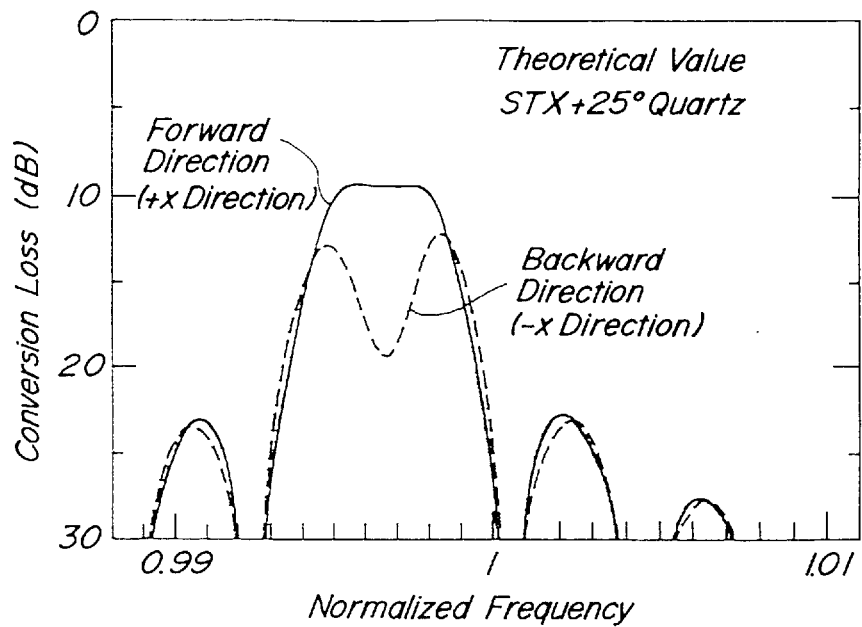
FIG. 25 is a graph showing a conversion loss of the SAW device shown in FIG. 24.

FIG. 25 shows a conversion loss of the fifth embodiment illustrated in FIG. 24. A conversion loss is theoretically calculated under conditions that the number of electrode pairs is 250λ, an aperture length A is 250λ, a thickness of the aluminum positive and negative aluminum electrodes 51 and 52 is 0.02λ, and a thickness of the floating electrode 53 made of aluminum is 0.01λ.

Figure 26:
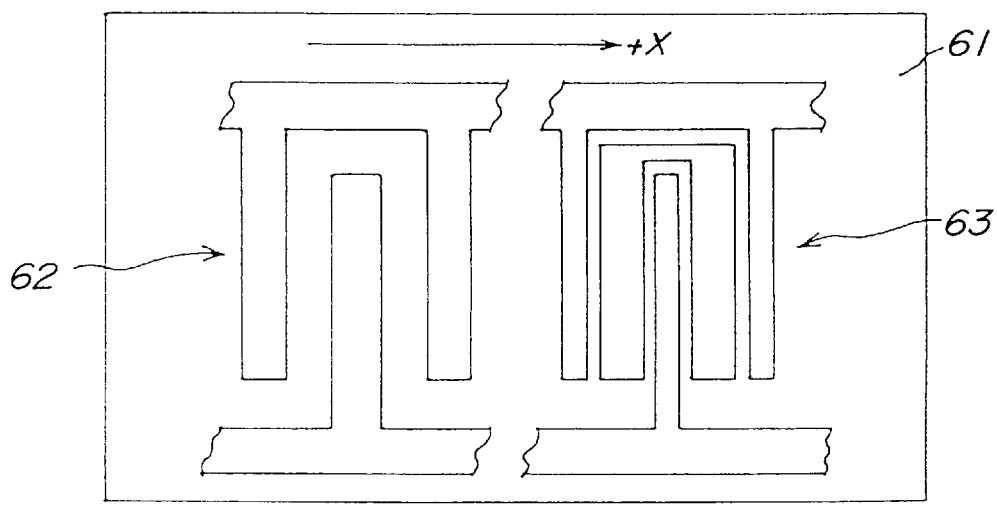
FIG. 26 is a plan view illustrating a SAW filter using the SAW device shown in FIG. 18.

FIG. 26 is a plan view depicting an embodiment of a SAW filter according to the invention. On an STX +25° cut quartz substrate 61, there are provided a transmitter side transducer 62 formed by the normal type electrode structure of λ/4 shown in FIG. 15 and a receiver side transducer 63 formed by the directionality reversed electrode structure shown in FIG. 19.

FIG. 27 is a plan view illustrating another embodiment of the SAW filter according to the invention. In the present embodiment, on an STX +25° cut quartz substrate 61 there are arranged a transmitter side transducer 62 constructed by the normal type electrode structure of λ/4 like as the previous embodiment and a receiver side transducer 64 formed by the directionality reversed electrode structure shown in FIG. 19.

FIG. 28 is a plan view depicting another embodiment of the SAW filter according to the invention. In the present embodiment, on an STX +25° cut quartz substrate 61 there are provided a transmitter side transducer 65 formed by the narrow gap type electrode structure shown in FIG. 24 by connecting all the floating electrode fingers by the bridge portions and a receiver side transducer 66 constructed by the directionality reversed electrode structure illustrated in FIG. 22. As explained above, the transmitter side transducer 65 has the directivity which is identical with that of the normal type electrode structure of λ/4, and therefore it is possible to realize the SAW filter having good characteristics by combining the transducer 65 with the directionality reversed electrode structure shown in FIG. 22.

In the above mentioned SAW filters according to the invention, the surface acoustic wave transmitted from the transmitter side transducer 65 can be efficiently received by the receiver side transducer 66, so that a insertion loss is small, a ripple is also small, and center frequencies are coincided with each other.

Figure 29:
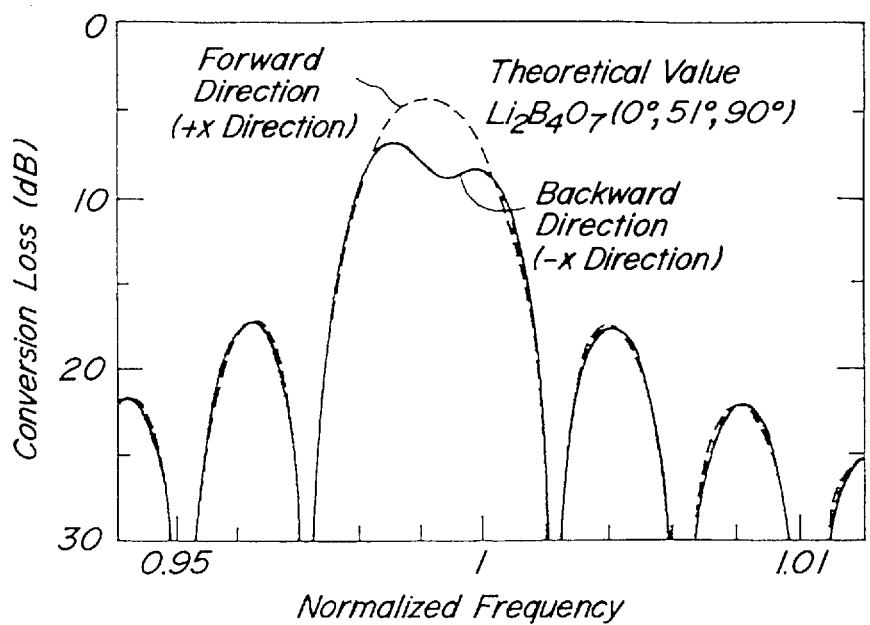
FIG. 29 is a graph representing a conversion loss of a sixth embodiment of the SAW device according to the second aspect of the invention.

FIG. 29 is a graph representing a conversion loss of a sixth embodiment of the surface acoustic transducer according to the invention, in which on a lithium tetraborate substrate of Euler angles (0°, 51°, 90°) which reveals an ideal NSPUDT behavior, there is provided the directionality reversed electrode structure shown in FIG. 18. A conversion loss is theoretically calculated under conditions that all the electrode fingers are formed by an aluminum film having a thickness of 0.025λ, an aperture length A is 200λ, and the number of electrode pairs is 50.

Figure 30:
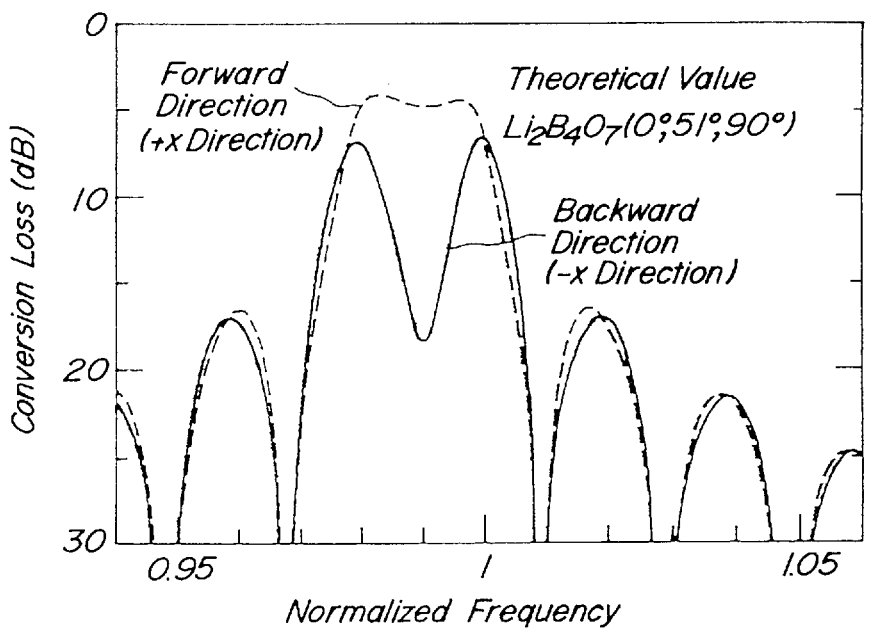
FIG. 30 is a graph denoting a conversion loss of a seventh embodiment of the SAW device according to the second aspect of the invention.

FIG. 30 is a graph showing a conversion loss of a seventh embodiment of the surface acoustic transducer according to the invention, in which on the above mentioned lithium tetraborate substrate having an ideal NSPUDT behavior, there is provided the narrow gap type directionality reversed electrode structure shown in FIG. 21. A conversion loss is theoretically calculated under conditions that the positive and negative electrode fingers are formed by an aluminum film having a thickness of 0.025λ, the floating electrode fingers are formed by an aluminum film having a thickness of 0.05λ, an aperture length A is 200λ, and the number of electrode pairs is 50.

In the embodiments illustrated in FIGS. 29 and 30, the directivity is opposite to that of the normal type electrode structure of λ/4 shown in FIG. 17.

FIG. 31 is a graph representing a conversion loss of an eighth embodiment of the surface acoustic transducer according to the invention, in which on the above mentioned lithium tetraborate substrate having an ideal NSPUDT behavior, there is provided the narrow gap type directionality reversed electrode structure shown in FIG. 24. A conversion loss is theoretically calculated under conditions that the positive and negative electrode fingers are formed by an aluminum film having a thickness of 0.05λ, the floating electrode fingers are formed by an aluminum film having a thickness of 0.025λ, an aperture length A is 200λ, and the number of electrode pairs is 50. From this graph, it can be seen that the present invention reveals the directivity which is the same as the normal type transducer of λ/4.

FIGS. 32A and 32B are plan and cross sectional views, respectively showing a ninth embodiment of the surface acoustic wave transducer according to the second aspect of the invention. In the present embodiment, on an STX +25° cut quartz substrate, there are provided positive electrode 71 and negative electrode 72. Positive electrode fingers 71a and negative electrode fingers 72a each having a width of about λ/4 are arranged interdigitally at a pitch of A while centers of successive fingers is separated by a distance of λ/2. Floating electrode fingers 73a having a width of about λ/4 are arranged between successive positive and negative electrode fingers 71a and 72a with interposing narrow gaps therebetween. Therefore, the transducer of the present invention is of the narrow gap type. All the floating electrode fingers 73a are connected to each other by means of bridge portions 73b.

In the present embodiment, all the electrodes are made of aluminum and a thickness of the floating electrode fingers 73a is larger than a thickness of the positive and negative electrode fingers 71a and 72a as illustrated in FIG. 32B. The gaps between successive electrode fingers 71a, 72a and 73a are filled with aluminum oxide film 74 formed by an anodic oxidization, so that there electrode fingers are electrically isolated by the aluminum oxide film 74 serving as a dielectric material. A size of the gap g between the positive and negative electrode fingers 71a and 72a and floating electrode fingers 73a is determined by a thickness of the aluminum oxide film 74 and is generally smaller than 1 μm. As shown in FIG. 32E, the directivity of the surface acoustic wave device of the present embodiment is opposite to the directivity of the normal type electrode structure of λ/4. It should be noted that FIGS. 32C and 32D correspond to FIGS. 18C and 18D, respectively.

FIGS. 33A and 33B are plan and cross sectional views, respectively showing a tenth embodiment of the surface acoustic wave transducer according to the second aspect of the invention. In the present embodiment, on an STX +25° cut quartz substrate, there are provided positive electrode 81 and negative electrode 82. Positive electrode fingers 81a and negative electrode fingers 82a each having a width of about λ/8 are arranged interdigitally at a pitch of λ while centers of successive fingers is separated by a distance of λ/2. Floating electrode fingers 83a having a width of about λ/8 are arranged between successive positive and negative electrode fingers 81a and 82a with an edge distance of about λ/8.

All the floating electrode fingers 83a are connected to each other by means of bridge portions 83b.

As shown in FIG. 33B, the positive and negative electrode fingers 81a and 82a are formed by an aluminum film having a thickness $t_1$ and the floating electrode fingers 83a are made of a laminated film of an aluminum film having a thickness of $t_1$ and a chromium film having a thickness of $t_2$. Such an electrode structure can be manufactured easily by means of the above mentioned selective etching due to electrochemical effect. That is, after successively applying an aluminum film and a chromium film over a whole surface, both the aluminum and chromium films are removed by a photolithography at portions except for the electrodes. Next, after removing a resist, the substrate is immersed into an etchant while a voltage is applied to the positive and negative electrodes 81 and 82 to remove only the chromium film on the positive and negative electrodes due to the electrochemical effect. In this manner, the electrode structure shown in FIG. 33B is obtained. It is also possible to use an etchant by means of which a chromium film to which a voltage is not applied is selectively removed. Then, a voltage is applied only to the floating electrode 83. In either cases, a desired electrode structure can be manufactured by only one photolithographic process.

Also in the present embodiment, the surface acoustic wave transducer has the directivity opposite to that of the normal type electrode structure of $\lambda/4$ as illustrated in FIG. 33E. FIGS. 33C and 33D show positions of the exciting and reflecting centers like FIGS. 18C and 18D, respectively.

Figure 34:
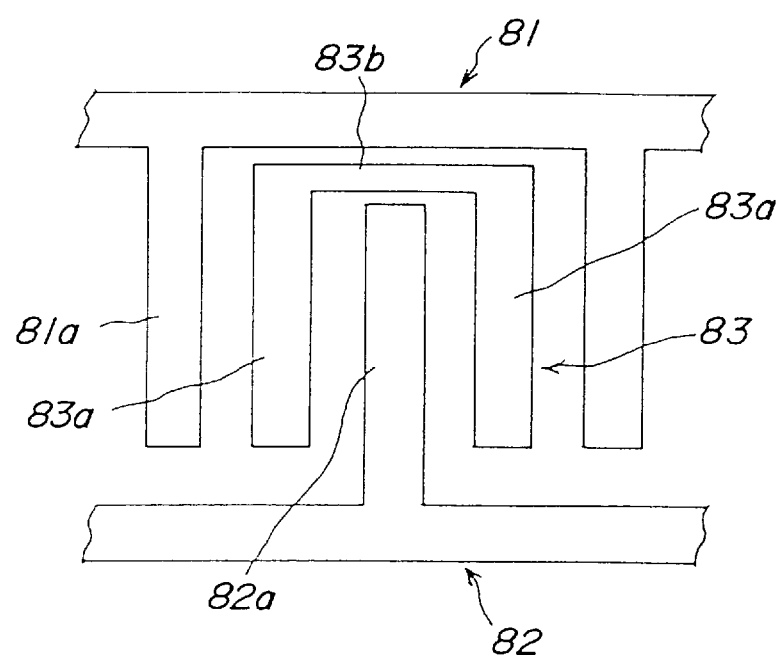
FIG. 34 is a plan view depicting the electrode structure of an eleventh embodiment of the SAW device according to the second aspect of the invention.

FIG. 34 is a plan view showing an eleventh embodiment of the surface acoustic wave device according to the second aspect of the invention. The present embodiment differs from the tenth embodiment illustrated in FIG. 33 only in a point that all the floating electrode fingers 83a of the floating electrode 83 are not coupled with each other. Within respective electrode pairs, two floating electrode fingers 83 are connected to each other by means of the bridge portion 83b. The surface acoustic wave device of the present embodiment has same characteristics as those of the tenth embodiment.

The present invention is not limited to the embodiments explained above, but many modifications and alternations may be conceived by those skilled in the art within the scope of claims. For instance, in the above embodiments, the piezoelectric substrate having NSPUDT behavior is formed by the (0°, 51°, 90°) cut lithium tetraborate single crystal substrate and STX +25° cut quartz substrate. However, according to the invention it is possible to use any kind of piezoelectric substrates having NSPUDT behavior. For example, lithium tetraborate substrates having cut angles represented by Euler angles ($\psi$, $\theta$, $\phi$) of $\psi=-5°-+5°$, $\theta=9°-29°$ and $32°-86°$ and $\phi=85°-95°0$ may be used. Furthermore, it is also possible to use piezoelectric substrates other than lithium tetraborate substrate and quartz. For instance, YZ +51.25° cut lithium tantalate (LiTaO$_3$) substrate, Y-$\theta$X ($\theta=25°-45°$) cut lithium niobate substrate and 128° rotated Y cut lithium niobate substrate. These substrates have been known to have NSPUDT behavior.

It should be noted that the object of the present invention could be attained although width, pitch, edge distance and thickness of electrodes deviate from the above mentioned values by about ±10% error during precise machinings. Moreover, if the directivity deviates from a desired one due to a material and cut angles of a substrate, this deviation can be corrected by slightly shifting a position of the floating electrode.

In the above explained embodiments, all the floating electrode fingers are coupled with each other or the two floating electrodes within respective electrode pairs are coupled with each other. According to the invention, all the floating electrodes may be separated from each other to form the opened-type floating electrode.

As explained above in detail, according to the invention, the electrode structure having the reversed directivity can be realized on the substrate having NSPUDT behavior, so that it is possible to obtain the surface acoustic wave device having a low loss and a good phase characteristic. Moreover, the electrode structure can be manufactured by only one process, so that the manufacturing process is simple, a yield is improved and cost is reduced. Particularly, in the embodiments of the invention in which the electrode structure is made of a same material, the manufacture becomes very simple and a desired size can be easily realized. Therefore, an insertion loss can be decreased and frequency and phase characteristics can be also improved.

According to the first aspect of the invention, the directionality reversed electrode structure is constructed under a basic dimension of $\lambda/8$ which is sufficiently large than $\lambda/12$ of a known directionality reversed electrode structure. Therefore, the directionality reversed electrode structure according to the invention can be manufactured easily and precisely.

According to the second aspect of the invention, by inverting the relationship of width and thickness of electrode fingers between the positive and negative electrodes and the floating electrode, the directivity can be reversed. Therefore, in a SAW filter, characteristics of the transmitter side transducer and receiver side transducer can be matched with each other, so that the center frequencies of these transducers can be easily made coincided with each other.

What is claimed is:

1. A surface acoustic wave device comprising:
   a piezoelectric substrate having such cut angles that the substrate reveals a natural single-phase unidirectional transducer behavior; and
   a directionality reversed electrode structure formed on a surface of said piezoelectric substrate and having a basic structure in which positive and negative electrode fingers each having a width of about $\lambda/8$, $\lambda$ being a wavelength of a surface acoustic wave, are arranged successively with an edge distance of about $\lambda/8$ and floating electrode fingers each having a width of about $3\lambda/8$ are arranged with an edge distance of about $\lambda/8$ with respect to positive electrode fingers, wherein $\lambda$ is a wavelength of a surface acoustic wave and said positive and negative electrode fingers are connectable to two terminals of a signal source or a load having 180° phase difference.

2. A surface wave acoustic device according to claim 1, wherein said piezoelectric substrates comprises a substrate selected from the group consisting of an STX+25° cut quartz substrate, a (45°, 55°, 0°) cut quartz substrate, an YZ +51.25° cut lithium tantalate (LiTaO$_3$) substrate, an Y- $\theta$X cut ($\theta=25°-45°$) lithium niobate (LiNbO$_3$) substrate, a 128° rotated Y $\theta$X cut ($\theta=20°-50°$)lithium niobate substrate and a lithium tetraborate (Li$_2$B$_4$O$_7$) substrate whose cut angles represented by Euler angles ($\psi$, $\theta$, $\phi$) satisfy $\psi=-5°-+5°$, $\theta=9°-29°$, 32 °–86° and $\phi=85°-95°$.

3. A surface acoustic wave device according to claim 1 formed as a surface acoustic wave filter, wherein said directionality reversed electrode structure is provided on the substrate as a receiver side transducer and the device further comprises a transmitter side transducer formed by a normal type electrode structure, in which positive electrode fingers and negative electrode fingers each having a width of about $\lambda/4$ are arranged interdigitally with an edge distance of about $\lambda/4$.

4. A surface acoustic wave device according to claim 3, wherein said piezoelectric substrate comprises an STX+25° cut quartz substrate.

5. A surface acoustic wave device according to claim 3, wherein said piezoelectric substrate comprises a lithium tetraborate substrate having cut angles represented by Euler angles ($\psi$, $\theta$, $\phi$) of $\psi=-5°-+5°$, $\theta=9°-29°$, $32°-86°$, and $\phi=85°-95°$.

6. A surface acoustic wave device comprising:
   a piezoelectric substrate having such cut angles that the substrate reveals a natural single-phase unidirectional transducer behavior; and
   an electrode structure including positive and negative electrode fingers arranged alternately with a pitch of $\lambda$ while a distance between centers of successive positive and negative electrode fingers is $\lambda/2$, and floating electrode fingers each being arranged between successive positive and negative electrode fingers and having a reflection coefficient which is different from that of the positive and negative electrode fingers, wherein $\lambda$ is a wavelength of a surface acoustic wave and said positive and negative electrode fingers are connected to two terminals of one of a signal source and a load having 180° phase difference.

7. A surface wave acoustic device according to claim 6, wherein said floating electrode fingers are arranged symmetrically within respective electrode pairs.

8. A surface acoustic wave device according to claim 6, wherein a width of said positive and negative electrode fingers is about $\lambda/8$ and said floating electrode fingers have a width of about $\lambda/4$ and are arranged between successive positive and negative electrode fingers with an edge distance of about $\lambda/16$.

9. A surface acoustic wave device according to claim 8, wherein all of said floating electrode fingers are connected to each other by means of bridge portions.

10. A surface acoustic wave device according to claim 8, wherein said floating electrode fingers within respective electrode pairs are connected to each other.

11. A surface acoustic wave device according to claim 6, wherein a width of said positive and negative electrode fingers is about $\lambda/4$ and said floating electrode fingers are arranged between successive positive electrode fingers and negative electrode fingers such that edges of the floating electrode fingers are opposed to edges of the positive and negative electrode fingers with interposing therebetween very narrow gaps of air or dielectric material, and said floating electrode fingers are formed by a metal film made of a same material as that of the positive and negative electrode fingers, but having a different thickness than that of the positive and negative electrode fingers.

12. A surface acoustic wave device according to claim 6, wherein a width of said positive and negative electrode fingers is about $\lambda/4$ and said floating electrode fingers are arranged between successive positive electrode fingers and negative electrode fingers such that edges of the floating electrode fingers are opposed to edges of the positive and negative electrode fingers with interposing therebetween very narrow gaps of air or dielectric material, and said floating electrode fingers are formed by a laminated metal film including a metal film made of a different material than that of the positive and negative electrode fingers.

13. A surface acoustic wave device according to claim 6, wherein a width of said positive and negative electrode fingers is about $\lambda/5$ and said floating electrode fingers are arranged between successive positive and negative electrode fingers such that edges of the floating electrode fingers are opposed to edges of the positive and negative electrode fingers with interposing therebetween very narrow gaps of air or dielectric material, and said floating electrode fingers are formed by a metal film made of a same material as that of the positive and negative electrode fingers, but having a different thickness than that of the positive and negative electrode fingers.

14. A surface acoustic wave device according to claim 6, wherein a width of said positive and negative electrode fingers is about $\lambda/5$ and said floating electrode fingers are arranged between successive positive and negative electrode fingers such that edges of the floating electrode fingers are opposed to edges of the positive and negative electrode fingers with interposing therebetween very narrow gaps of air or dielectric material, and said floating electrode fingers are formed by a laminated metal film including a metal film made of a different material than that of the positive and negative electrode fingers.

15. A surface acoustic wave device according to claim 6, wherein a width of said positive and negative electrode fingers is about $\lambda/8$, said floating electrode fingers have a width of about $\lambda/8$ and are arranged between successive positive and negative electrode fingers with an edge distance of about $\lambda/8$, and said floating electrode fingers are formed by a metal film made of a same material as that of the positive and negative electrode fingers, but having a different thickness than that of the positive and negative electrode fingers.

16. A surface acoustic wave device according to claim 6, wherein a width of said positive and negative electrode fingers is about $\lambda/8$, said floating electrode fingers have a width of about $\lambda/8$ and are arranged between successive positive and negative electrode fingers with an edge distance of about $\lambda/8$, and said floating electrode fingers are formed by a laminated metal film including a metal film made of a different material than that of the positive and negative electrode fingers.

17. A surface acoustic wave device according to claim 6, wherein said piezoelectric is substrate is selected from the group consisting of an STX+25° cut quartz substrate, a (45°, 55°, 0°) cut quartz substrate, an YZ +51.25° cut lithium tantalate (LiTaO$_3$) substrate, an Y-$\theta$X cut ($\theta=25°-45°$) lithium niobate (LiNbO$_3$) substrate, a 128° rotated Y cut lithium niobate substrate and a lithium tetraborate (Li$_2$B$_4$O$_7$) substrate whose cut angles represented by Euler angles ($\psi$, $\theta$, $\phi$) satisfy $\psi=-5°-+5°$, $\theta=9°-29°$, $32°-86°$ and $\phi=85°-95°$.

18. A surface acoustic wave device according to claim 6 formed as a surface acoustic wave filter, wherein said electrode structure is provided on the substrate as a receiver or transmitter side transducer and the device further comprises a transmitter or receiver side transducer formed by a normal type electrode structure, in which positive electrode fingers and negative electrode fingers each having a width of about $\lambda/4$ are arranged interdigitally with an edge distance of about $\lambda/4$.

19. A surface acoustic wave device according to claim 6 formed as a surface acoustic wave filter, wherein said electrode structure is provided on the substrate as a transmitter or receiver side transducer and the device further comprises a receiver or transmitter side transducer constructed by a second electrode structure having a corresponding construction as that of said electrode structure but having an opposite directivity to that of said electrode structure.

20. A surface acoustic wave device according to claim 6, wherein said piezoelectric substrate is formed by a lithium tetraborate (Li$_2$B$_4$O$_7$) substrate whose cut angles represented by Euler angles ($\psi$, $\theta$, $\phi$) satisfy $\psi=-5°-+5°$, $\theta=9°-29°$, $32°-86°$ and $\phi=85°-95°$.

21. A surface acoustic wave device according to claim 6, wherein said poiezoelectric substrate is formed by an STX+25° cut quartz substrate.

* * * * *